(12) United States Patent
Nishi

(10) Patent No.: US 6,198,527 B1
(45) Date of Patent: *Mar. 6, 2001

(54) PROJECTION EXPOSURE APPARATUS AND EXPOSURE METHOD

(75) Inventor: Kenji Nishi, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/158,576

(22) Filed: Sep. 22, 1998

Related U.S. Application Data

(63) Continuation of application No. 08/967,344, filed on Oct. 27, 1997, now abandoned, which is a continuation of application No. 08/411,053, filed on Mar. 27, 1995, now abandoned, which is a continuation of application No. 08/120,061, filed on Sep. 13, 1993, now abandoned.

(30) Foreign Application Priority Data

Sep. 14, 1992 (JP) .................................... 4-244481
Sep. 14, 1992 (JP) .................................... 4-244482

(51) Int. Cl.⁷ ............................ G03B 27/52; G01B 11/00
(52) U.S. Cl. .............................................. 355/53; 356/401
(58) Field of Search ............................. 355/53.2, 53.22, 355/53.24, 53.26, 53.28; 356/401, 400, 399

(56) References Cited

U.S. PATENT DOCUMENTS

| | | | |
|---|---|---|---|
| 4,452,526 * | 6/1984 | Johannsmeier et al. ............. | 355/43 |
| 4,897,553 * | 1/1990 | Nishi ................................... | 250/548 |
| 5,118,953 * | 6/1992 | Ota et al. ............................ | 250/548 |
| 5,138,176 * | 8/1992 | Nishi ................................... | 250/548 |
| 5,151,749 * | 9/1992 | Tanimoto et al. ................... | 356/375 |
| 5,151,750 * | 9/1992 | Magome et al. ..................... | 356/401 |
| 5,171,999 * | 12/1992 | Komatsu et al. .................... | 250/548 |
| 5,243,195 * | 9/1993 | Nishi ................................... | 250/548 |
| 5,424,552 * | 6/1995 | Tsuji et al. .......................... | 250/548 |

* cited by examiner

Primary Examiner—Russell Adams
Assistant Examiner—Rodney Fuller
(74) Attorney, Agent, or Firm—Vorys, Sater, Seymour and Pease LLP

(57) ABSTRACT

An exposure apparatus for exposing mask patterns on a sensitive substrate includes a first mark detecting system for detecting a substrate mark in a detection area positioned at a predetermined interval from the optical axis of a projection optical system, and a second mark detecting system for detecting a mask mark formed at a predetermined position on a mask in the image field of the projection optical system. First and second fiducial mark members are mounted on a substrate stage with a fiducial plate. The mark members have a predetermined positional relation so that the first fiducial mark member is positioned in the detection area of the first mark detecting system when the second fiducial mark member is positioned in a predetermined relationship with respect to the position where the mask mark is to be present in the image field of the projection optical system. A stage control system moves the substrate stage based on a coordinate system obtained by correcting a coordinate axis of a substrate stage position measuring device by an amount corresponding to an inclination of the fiducial plate with respect to the coordinate axis.

34 Claims, 13 Drawing Sheets

PROJECTION EXPOSURE APPARATUS AND EXPOSURE METHOD

CROSS-REFERENCE TO RELATED APPLICATIONS

This is a continuation of application Ser. No. 08/967,344 filed Oct. 27, 1997, which is a continuation of application Ser. No. 08/411,053 filed Mar. 27, 1995, which is a continuation of application Ser. No. 08/120,061 filed Sep. 13, 1993 (all now abandoned).

BACKGROUND OF THE INVENTION

1. Field of the Invention

The present invention relates to a positioning method for a projection exposure apparatus for exposing mask patterns on a sensitive member coated on a plate such as a semiconductor wafer or a glass plate for a liquid crystal display element and, more particularly, to a projection exposure apparatus having a function of controlling a so-called base line amount of an off-axis alignment system with high precision, and an exposure method.

2. Related Background Art

In a conventional projection exposure apparatus having an off-axis alignment system, as disclosed in Japanese Laid-Open Patent Application Nos. 53-56975 and 56-134737, a fiducial mark plate is fixed on a wafer stage which two-dimensionally moves according to a step-and-repeat scheme while holding a wafer as a sensitive plate, and the distance between the off-axis alignment system and a projection optical system, i.e., a so-called base line amount, is controlled by using this fiducial mark plate.

FIG. 16 shows a main part of a conventional projection exposure apparatus having an off-axis alignment system. Referring to FIG. 16, exposure light from a light source system (not shown) is focused by a main condenser lens 1 to illuminate a reticle R with uniform illuminance. The reticle R is held on a reticle stage 2. The reticle stage 2 holds the reticle R while a center Rc of the reticle R is aligned with an optical axis AX of a projection optical system PL. A pair of reticle marks 3A and 3B for alignment are formed outside a pattern area on the lower surface of the reticle R. Alignment systems 5A and 5B of a TTR (through the reticle) scheme are arranged above the reticle marks 3A and 3B through mirrors 4A and 4B, respectively.

When an exposure is to be performed, a pattern of the reticle R is projected/exposed on each shot area of a wafer W on a wafer stage 6 through the projection optical system PL. A wafer mark for alignment is formed in each shot area of the wafer W. A fiducial mark plate 7 having a mark 8 for alignment formed thereon is fixed on a portion near the wafer W on the wafer stage 6. When the wafer stage 6 is positioned such that the fiducial mark plate 7 is set at a position almost conjugate to the reticle marks 3A and 3B within the projection field of the projection optical system PL, the reticle mark 3A or 3B and the mark 8 are simultaneously detected by the alignment systems 5A and 5B above the reticle R. A distance La between the reticle mark 3A (or 3B) and the center Rc of the reticle R is a design value, and the distance between the projection point of the reticle mark 3A and the optical axis AX on an image plane of the projection optical system PL (the surface of the fiducial mark plate 7) is represented by La/M, where M is the magnification of the projection optical system PL when viewed from the wafer W side to the reticle R side. If the projection optical system PL is a ⅕ reduction projection optical system, M=5.

An off-axis wafer alignment system 9 is arranged outside the projection optical system PL. The optical axis of the wafer alignment system 9 is parallel to the optical axis AX of the projection optical system PL. An index plate 10 having an index mark formed thereon is fixed inside the wafer alignment system 9. The surface of the index plate 10 on which the index mark is formed is conjugate to the surface of the mark 8.

For example, a base line amount BL of the wafer alignment system 9 is defined as the distance between the optical axis, of the wafer alignment system 9, located on the wafer stage 6 and a projection point, of the center Rc of the reticle R, formed by the projection optical system PL. When the base line amount BL is to be measured, the wafer stage 6 is driven to move, for example, the mark 8 of the fiducial mark plate 7 to a position A immediately below the wafer alignment system 9. The positional offset amount of an image of the mark 8 with respect to an index mark in the wafer alignment system 9 is read together with the coordinates of the wafer stage 6 at this time. The coordinates of the wafer stage 6 are measured by a laser interferometer with high resolution. With this operation, the coordinates (X1,Y1) of the wafer stage 6 when the mark 8 is on the optical axis of the wafer alignment system 9 can be obtained.

Subsequently, the wafer stage 6 is driven to sequentially move the mark 8 of the fiducial mark plate 7 to positions near positions C and B which are conjugate to the reticle marks 3A and 3B. The positional offset amounts of an image of the mark 8 with respect to the reticle marks 3A and 3B are read together with the corresponding coordinates of the wafer stage 6. With this operation, the coordinates (X2,Y2) of the wafer stage 6 when the mark 8 is located at the middle point between the reticle marks 3A and 3B, i.e., a conjugate point of the center Rc of the reticle R, can be obtained. Therefore, the base line amount BL can be obtained as the distance between the coordinates (X1,Y1) and the coordinates (X2,Y2). This base line amount BL is used afterward as a fiducial amount used for positioning of each shot area of the wafer W within the exposure area of the projection optical system PL on the basis of the coordinates of the wafer mark on the wafer W which are read by the wafer alignment system 9.

Letting XP be the distance between the center of a given shot area on the wafer W and a corresponding wafer mark in the X direction, X3 be the position of the wafer stage 6 in the X direction when the wafer mark is aligned with the optical axis of the wafer alignment system 9, and BLx be the X-direction component of the base line BL, the wafer stage 6 may be moved by the amount given by the following expression in order to align the center of the shot area designated by the wafer mark with the projection point of the center Rc of the reticle R:

$$X3-BLx-XP$$

The moving amount in the Y direction can be represented by a similar expression. Note that this expression is based on the arrangement shown in FIG. 16, and different calculation methods are used depending on the positions of the reticle marks 3A and 3B or the arrangement of the wafer alignment system 9.

With any expression for calculation, after the position of each wafer mark on the wafer W is detected in advance by using the off-axis wafer alignment system 9, each shot area on the wafer W is positioned and exposed within the exposure area of the projection optical system PL in accordance with each detected position, thereby accurately superimposing and exposing a pattern of the reticle R on each shot area of the wafer W.

Since the superposition precision deteriorates even though the reticle R is mounted such that it is rotated about the optical axis of the projection optical system PL from a fiducial angle, the rotational amount (reticle rotation) of the reticle R is measured as follows. Referring to FIG. 16, the wafer stage 6 is driven to sequentially move the mark 8 of the fiducial mark plate 7 to the positions B and C, and the relative positional relationships between a conjugate image of the mark 8 and the reticle marks 3A and 3B are measured by the alignment systems 5A and 5B, respectively. With this operation, the rotational amount of the reticle R based on the traveling direction of the wafer stage 6 is measured. In the conventional apparatus, the rotational amount of the reticle R is adjusted by a reticle fine movement mechanism (not shown) such that the rotational amount of the reticle R based on the traveling direction of the wafer stage 6 is set to be a predetermined allowable value or less.

In the conventional projection exposure apparatus, since the base line amount of the off-axis wafer alignment system 9 and the rotational amount of the reticle R are measured on the basis of the traveling direction of the wafer stage 6, these amounts cannot be measured with high precision because of a measurement error or the like in a coordinate measurement system for the wafer stage 6. More specifically, an error is included in the measurement value of the coordinates of the wafer stage 6 owing to the influences of fluctuations in the optical path of a laser interferometer for monitoring the coordinates of the wafer stage 6, an error in the reset position for the initial coordinates of the wafer stage 6, an error in the set position of a movable mirror for reflecting a laser beam above the wafer stage 6, and the like. Therefore, errors are included in the base line amount and the rotational amount of the reticle R based on the measurement value.

In the conventional apparatus, the base line amount of the wafer alignment system 9 is obtained every time the reticle R is replaced.

In the conventional projection exposure apparatus, the base line amount is measured every time the reticle R is replaced, and exposure is performed after, for example, several hundred wafers are aligned by using the wafer alignment system 9. Since exposure is continuously performed, the temperature near the wafer stage 6 changes. For this reason, a drift occurs in the relative distance between the detection center of the wafer alignment system 9 and the projection position of the center of the reticle R. As a result, the superposition precision of a pattern image of the reticle R and a pattern formed on the wafer deteriorates.

FIG. 15A shows an example of a change in the drift amount (unit: μm) of the base line amount. In FIG. 15A, the abscissa represents the number of wafers to be exposed after the reticle R is replaced, and the ordinate represents the drift amount of the base line amount. As is apparent from FIG. 15A, even if measurement of a base line amount is performed and the drift amount is set to be 0 at time Q after replacement of the reticle R, the drift amount gradually increases.

In order to eliminate this inconvenience, U.S. Pat. No. 4,897,553 discloses a method of measuring a base line amount every time a wafer is replaced, and a method of measuring a base line amount every time a predetermined number of wafers (e.g., several wafers) are exposed. If, however, a base line amount is measured every time a wafer is replaced, the throughput is reduced because measurement of a base line amount takes much time. When a base line amount is to be measured every time a predetermined number of wafers are replaced, measurement of a base line amount is performed at almost equal time intervals, i.e., times R1, R2, R3, . . . , as shown in FIG. 15B. However, the drift amount of the base line amount does not change linearly with-respect to the number of wafers to be exposed (substantially proportional to time). If, therefore, a wafer alignment system in which the drift amount increases immediately after an exposure operation is started is used, the drift amount may exceed an allowable value.

SUMMARY OF THE INVENTION

It is an object of the present invention to provide a positioning method of measuring the base line amount of an off-axis alignment system of a projection exposure apparatus and the rotational amount of a reticle therein with high precision.

It is another object of the present invention to provide an alignment method which can suppress the drift amount of the base line amount of an off-axis alignment system of a projection exposure apparatus to an allowable value or less without greatly decreasing the throughput.

According to the present invention, there is provided an exposure apparatus for exposing mask patterns on a sensitive plate, the apparatus comprising:

a mask stage holding the mask;

a plate stage movable while holding the sensitive plate;

a projection optical system imaging the mask patterns at a predetermined position on the sensitive plate;

a first mark detecting system for detecting a plate mark formed on the sensitive plate in a detection area positioned at a predetermined interval from the optical axis of the projection optical system;

a second mark detecting system for detecting a mask mark formed at a predetermined position on the mask in the image field of the projection optical system;

a first fiducial mark member arranged on a part of the plate stage, having a configuration capable of being detected by the first mark detecting system;

a second fiducial mark member arranged on a part of the plate stage, having a configuration capable of being detected by the second mark detecting system through the projection optical system;

a mounting member for mounting the first fiducial mark member and the second fiducial mark member with a constant predetermined positional relationship so as to position the first fiducial mark member in the detection area of the first mark detecting system when the second fiducial mark member is positioned in a predetermined relationship with respect to the position where the mask mark is to be present in the image field of the projection optical system;

plate stage position measuring means for measuring a position of the plate stage; and coordinate setting means for obtaining an inclination of a measurement coordinate axis of the plate stage position measuring means with respect to the mounting member in advance, and setting a moving coordinate axis of the plate stage with reference to the mounting member.

According to the present invention, since the apparatus includes the fiducial mark plate on which the first fiducial mark and the second fiducial mark as a fiducial mark for a mask are arranged apart from each other such that the first and second fiducial marks are simultaneously detected by the first and second mark detecting means, respectively, the base line amount of the off-axis alignment system can be measured with high precision without moving the plate stage. In addition, the rotational amount of a reticle can be measured with high precision by using the second fiducial mark of the fiducial mark plate.

When the rotational amount of a mask is obtained with reference to a plurality of second fiducial marks on the fiducial mark plate, the rotational error of the plate stage coordinate measuring means with respect to the coordinate system can be measured with high precision at high speed on the basis of the rotational amount of the mask and the inclination of the coordinate system of the plate stage coordinate measuring means with respect to the fiducial mark plate.

In addition, when the second mark detecting means is arranged to be movable along a predetermined axis, and the second mark detecting means is moved along the coordinate axis of the plate stage coordinate measuring means which has undergone correction of the inclination calculated in accordance with the above-described procedure, a base line amount can be measured with high precision even if the second mark detecting means moves.

According to another aspect of the present invention, there is provided an exposure method for exposing mask patterns on a sensitive plate, the method comprising:

the step of replacing a plurality of the sensitive plates by using an exposure apparatus including:

a mask stage holding the mask;

a plate stage movable while holding the sensitive plate;

a projection optical system imaging the mask patterns at a predetermined position on the sensitive plate;

a first mark detecting system for detecting a plate mark formed on the sensitive plate in a detection area positioned at a predetermined intervals from the optical axis of the projection optical system;

a first fiducial mark member arranged on a part of the plate stage, having a configuration capable of being detected by the first mark detecting system; and plate stage position measuring means for measuring a position of the plate stage;

the base line measurement step of measuring a distance between a center position of the detection area positioned and the optical axis of the projection optical system, the base line measurement step being executed every time a predetermined number of sensitive plates are replaced or at predetermined time intervals; and the step of changing the number of sensitive plates as a unit for the replacement or the predetermined time interval as a unit for the replacement.

According to the present invention, since the intervals of re-detection of the base line error amount, i.e., a certain number of sensitive plates or a certain time period as a unit is set to be variable, the base line amount can be suppressed to an allowable value or less without greatly decreasing the throughput.

When the first and second marks are arranged apart from each other on the fiducial mark plate on the plate stage such that the first and second marks are simultaneously detected by the first and second mark detecting means, a base line check can be performed in a very short period of time with high precision.

When the intervals at which a base line error amount is re-detected is set to be longer near the end of an exposure operation than at the start time of the exposure operation, the base line amount of an alignment system in which a change in the drift amount of the base line amount after the start time of the exposure operation tends to be gradually reduced can be suppressed to an allowable value or less without decreasing the throughput.

DETAILED DESCRIPTION OF THE PREFERRED EMBODIMENTS

An embodiment of the present invention will be described below with reference to the accompanying drawings.

Figure 1:
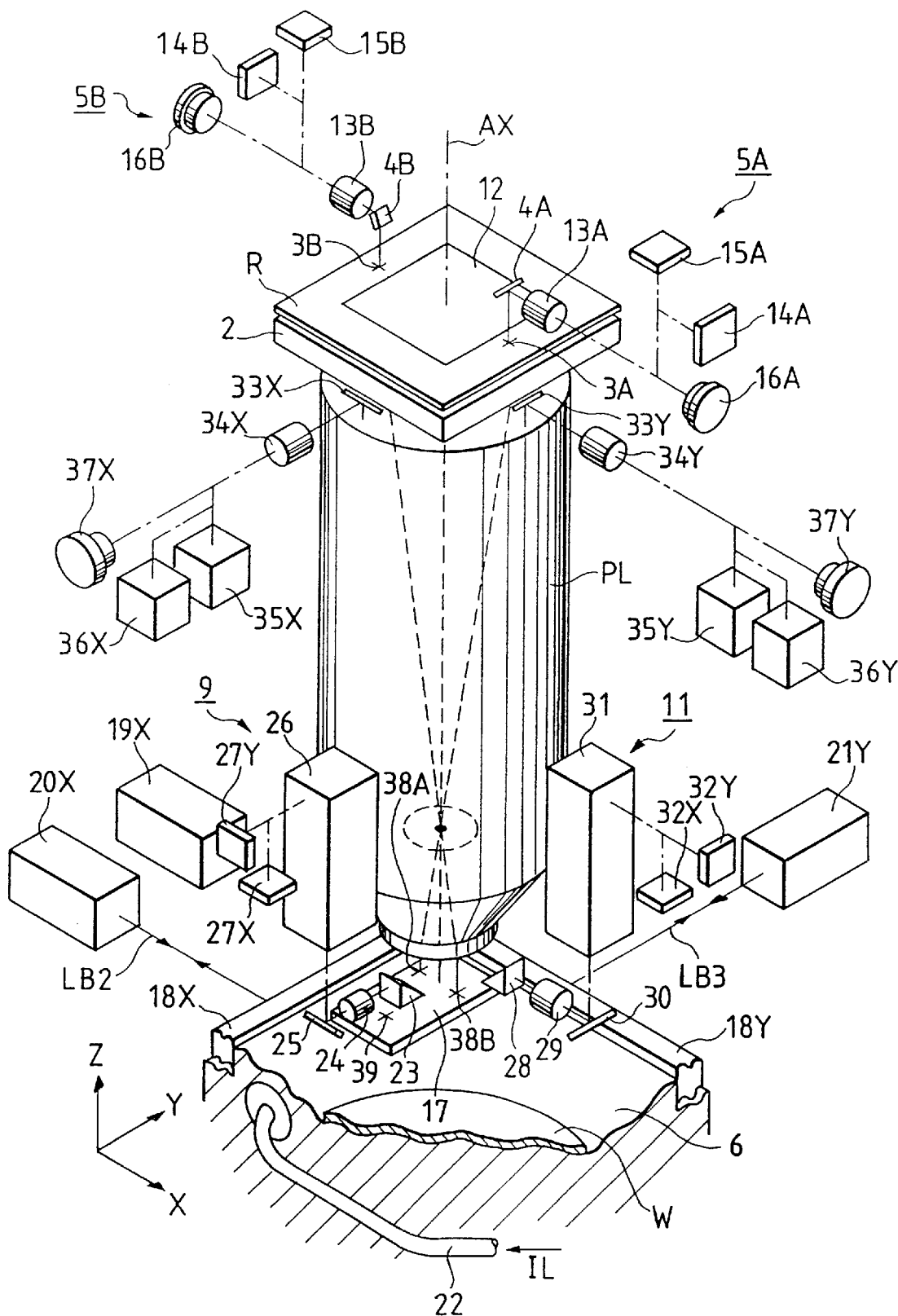
FIG. 1 is a partially cutaway perspective view of a main part of a projection exposure apparatus according to an embodiment of the present invention.

FIG. 1 shows the arrangement of a projection exposure apparatus of this embodiment. The same reference numerals in FIG. 1 denote the same parts as in FIG. 16. Two reticle marks 3A and 3B for alignment are set outside a pattern area 12, on a reticle R, on which a circuit pattern to be exposed is formed. The reticle marks 3A and 3B are located to oppose each other. An alignment system 5A of the TTR (through the reticle) scheme is arranged above one reticle mark 3A through a mirror 4A. Similarly, a TTR alignment system 5B is arranged above the other reticle mark 3B through a mirror 4B. The reticle R is held on a reticle stage 2. The reticle stage 2 is driven by a driving system (not shown) to translate (in the X and Y directions) and rotate the reticle R within a two-dimensional plane.

In an exposure operation, a pattern of the reticle R is projected/exposed on each shot area of a wafer (substrate) W on a wafer stage (substrate stage) 6 through a projection optical system PL. In one TTR alignment system 5A above the reticle R, images of the reticle mark 3A and a mark in the projection field of the projection optical system PL are formed on the imaging surface of an image pickup element 14A for the Y direction and on the imaging surface of an image pickup element 15A for the X direction by an objective lens 13A through the mirror 4A. Part of the light from the objective lens 13A is also incident on a light-receiving element 16A. The light-receiving surface of the light-receiving element 16A is conjugate to the pupil plane (Fourier transform plane) of the projection optical system PL. Similarly, in the other TTR alignment system 5B, images of the reticle mark 3B and the mark in the projection field of the projection optical system PL are formed on the imaging surface of an image pickup element 14B for the Y direction and on the imaging surface of an image pickup element 15B for the X direction by an objective lens 13B through the mirror 4B. Part of the light from the objective lens 13B is also incident on a light-receiving element 16B having a light-receiving surface conjugate to the pupil plane of the projection optical system PL.

In this embodiment, movable mirrors 18X and 18Y are respectively mounted on the end portions on the wafer stage 6 in the X and Y directions. The movable mirror 18X serves to reflect laser beams LB1 and LB2 (see FIG. 2A), which are respectively emitted from a laser interferometer 19X for the X direction and a laser interferometer 20X for pitching measurement in a direction parallel to the X direction, in the incident direction. The movable mirror 18Y serves to reflect a laser beam LB3, which is emitted from a laser interferometer 21Y for the Y direction in a direction parallel to the Y direction perpendicular to the X direction, in the incident direction. In this case, the extended line of the laser beam LB1 crosses the extended line of the laser beam LB3 on an optical axis AX of the projection optical system PL.

A large fiducial mark plate 17 is fixed at a position located near the wafer W on the wafer stage 6 and inside the area where the movable mirror 18X and the movable mirror 18Y cross each other. The large fiducial mark plate 17 has two fiducial marks 38A and 38B formed along a straight line substantially parallel to the X direction, and a fiducial mark 39 formed at a position separated from the fiducial marks 38A and 38B in the Y direction along the perpendicular bisector defined thereby. The distance between the fiducial marks 38A and 38B is set such that they can be simultaneously observed by the TTR alignment systems SA and 5B. Alignment marks other those described above are also formed on the large fiducial mark plate 17, as will be described later.

The large fiducial mark plate 17 is obtained by forming a deposition layer consisting of chromium or the like on the surface of a transparent member having a low expansion coefficient, e.g., a quartz plate, and forming light-transmitting portions on part of the deposition layer in the shapes of fiducial marks by etching or the like. On the large fiducial mark plate 17, in-addition to the fiducial marks illuminated from the projection optical system PL side, marks such as the fiducial marks 38A and 38B illuminated from the wafer stage 6 side are formed. A light guide 22 guides illumination light IL having the same wavelength band as that of exposure light used to illuminate the reticle R into the wafer stage 6. A predetermined mark on the large fiducial mark plate 17 is illuminated with the illumination light IL from the bottom surface side.

A wafer alignment system 9, which is a mark detection system capable of detecting a mark on the substrate, is constituted by a reflecting prism 23 opposing the wafer stage 6, an objective lens 24, a mirror 25, a main body portion 26, an image pickup element 27X for the X direction, and an image pickup element 27Y for the Y direction. The wafer alignment system 9 is mounted on a side surface portion of the projection optical system PL in the Y direction. An image of a mark in an area opposing the reflecting prism 23 is formed on the imaging surfaces of the image pickup elements 27X and 27Y. In the embodiment, when the wafer stage 6 is driven to set the fiducial marks 38A and 38B of the large fiducial mark plate 17 to positions where the fiducial marks 38A and 38B can be respectively observed through the TTR alignment systems 5A and 5B, the position of the fiducial mark 39 is set within the observation field of the wafer alignment system 9. That is, the above-mentioned fiducial marks on the large fiducial mark plate 17 can be simultaneously observed by the TTR alignment systems 5A and 5B and the wafer alignment system 9. Therefore, the base line amount of the off-axis wafer alignment system 9 can be measured without moving the wafer stage 6.

An auxiliary wafer alignment system 11 is fixed to a side surface portion of the projection optical system PL in the X direction. The auxiliary wafer alignment system 11 is also constituted by a reflecting prism 28 opposing the wafer stage 6, an objective lens 29, a mirror 30, a main body portion 31, an image pickup element 32X for the X direction, and an image pickup element 32Y for the Y direction. The auxiliary wafer alignment system 11 is used to observe the position of a fiducial mark on the large fiducial mark plate 17, similar to the wafer alignment system 9.

Furthermore, in the embodiment, wafer alignment systems of the TTL (through the lens) scheme for detecting marks on the wafer W and the large fiducial mark plate 17 only through the projection optical system PL without the mediacy of the reticle R are separately arranged for the X and Y directions. The TTL wafer alignment system for the X direction includes a mirror 33X fixed on an outer peripheral portion in the Y direction between the reticle stage 2 and the projection optical system PL, an objective lens 34X, and a light-receiving element 37X for receiving light returned from the projection optical system PL side through the objective lens 34X. In addition, in order to cause detection light for alignment to be incident on the projection optical system PL through the objective lens 34X, a light-transmission system of a laser step alignment scheme (to be referred to as an LSA light-transmission system hereinafter) 35X for transmitting a slit-like light beam onto the wafer stage 6, and a light-transmission system (to be referred to as an LIA light-transmission system hereinafter) 36X for transmitting two coherent light beams are arranged according to a switching scheme.

Similarly, the TTL wafer alignment system for the Y direction includes a mirror 33Y fixed to an outer peripheral portion in the X direction between the reticle stage 2 and the projection optical system PL, an objective lens 34Y, and a light-receiving element 37Y for receiving light returned from the projection optical system PL side through the objective lens 34Y. In addition, an LSA light-transmission system 35Y for transmitting a slit-like light beam onto the wafer stage 6, and an LIA light-transmission system 36Y for transmitting two coherent light beams are arranged according to a switching scheme to be symmetrical with the TTL wafer alignment system for the X direction. Although the TTL wafer alignment for the Y direction is arranged in the positive direction of the X axis with respect to the projection optical system PL in FIG. 1, the wafer alignment is actually arranged in the negative direction of the X axis.

Figure 2A:
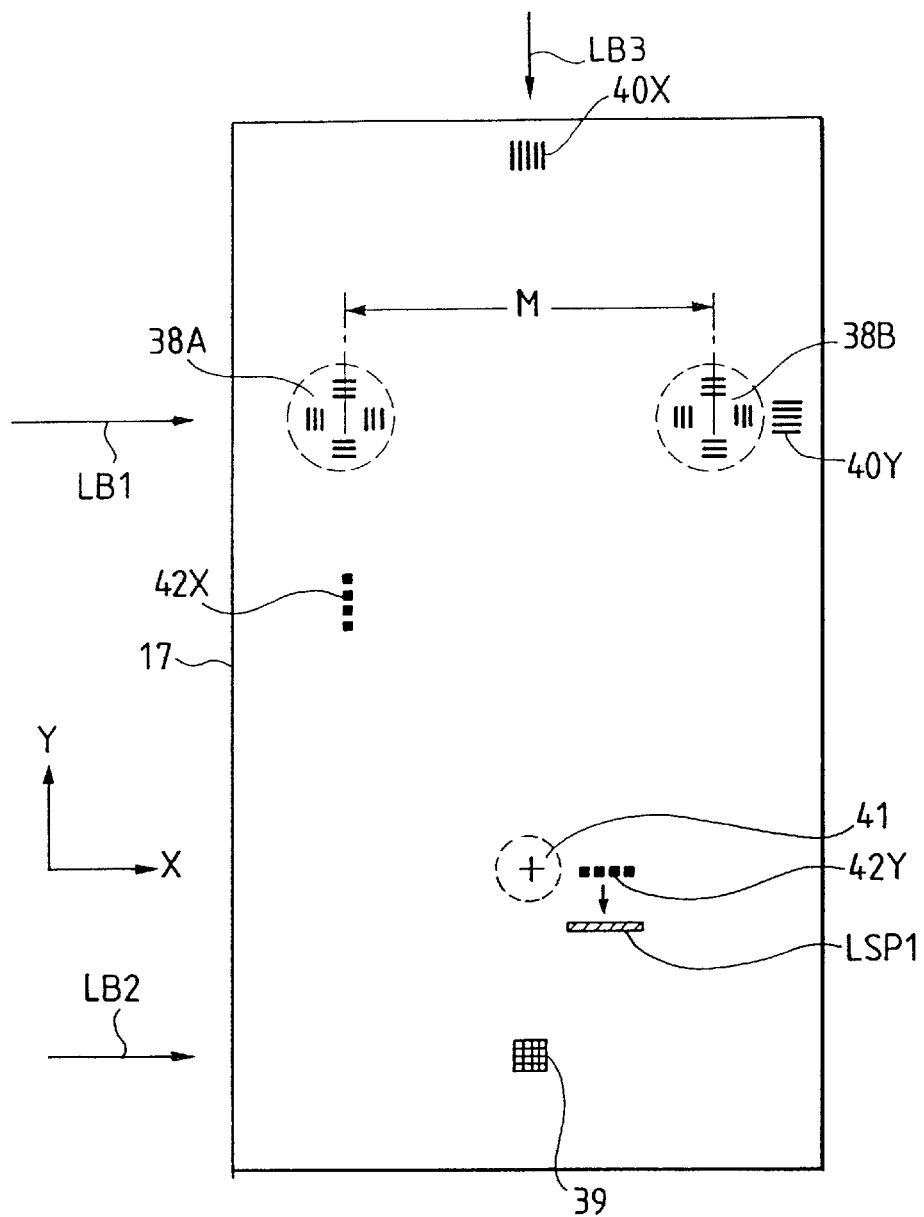
FIG. 2A is an enlarged plan view of a large fiducial mark plate 17.

FIG. 2A shows the shapes and positions of marks on the large fiducial mark plate 17 in FIG. 1 in detail. As shown in FIG. 2A, each of the fiducial marks 38A and 38B for the reticle marks is formed by arranging light-shielding multi-mark patterns for the X and Y directions within a light-transmitting portion encircled by a broken line. The fiducial mark 39 for the off-axis wafer alignment system 9 is a reflective lattice pattern having bars formed in the X and Y directions, respectively, at a predetermined pitch. Let M be the distance between the fiducial marks 38A and 38B in the X direction. The light-transmitting portions encircled by the broken lines and including the fiducial marks 38A and 38B serving for the reticle marks are illuminated with illumination light, guided by the light guide 22 in FIG. 1, from their bottom portions. That is, the fiducial marks 38A and 38B are emissive marks.

A fiducial mark 40Y for interference between two light beams, which is constituted by diffraction grating elements formed at a predetermined pitch in the Y direction, is arranged near the fiducial mark 38B in the X direction. A fiducial mark 40X for interference between two light beams, which is constituted by diffraction grating elements formed at a predetermined pitch in the X direction, is arranged at a position coinciding with the position of the fiducial mark 40Y when it is rotated counterclockwise about the middle point between the fiducial marks 38A and 38B through 90°. The X-direction position of the fiducial mark 40X for interference between two light beams and the Y-direction position of the fiducial mark 40Y are respectively detected by two laser beams transmitted from the LIA light-transmission systems 36X and 36Y in FIG. 1. The fiducial marks 40X and 40Y are arranged such that they are illuminated with two illumination light beams from the LIA light-transmission systems 36X and 36Y in FIG. 1, while the fiducial marks 38A and 38B are observed through the TTR alignment systems 5A and 5B in FIG. 1. Note, as described above, that the TTL wafer alignment system including the LSA light-transmission system 35Y and the LIA light-transmission system 36Y in FIG. 1 is actually arranged on the opposite side of the projection optical system PL.

A cross mark 41 consisting of a cross opening pattern is formed between the fiducial mark 39 and the middle point between the fiducial marks 38A and 38B at a position closer to the fiducial mark 39. This cross mark 41 is also illuminated with illumination light guided by the light guide 22 in FIG. 1 from the bottom surface of the large fiducial mark plate 17. For this reason, the cross mark 41 will be referred to as the emissive cross mark 41 hereinafter. A slit scanning fiducial mark 42Y for the Y direction, which is constituted by reflective patterns, each several $\mu$m square, arranged in the X direction, is formed near the emissive cross mark 41 on the large fiducial mark plate 17 in the X direction. A slit scanning fiducial mark 42X for the X direction, which is constituted by reflective patterns, each several $\mu$m square, arranged in the Y direction, is formed at a position coinciding with the position of the fiducial mark 42Y when it is rotated counterclockwise about a point separated from the emissive cross mark 41 in the negative direction of the X axis by a distance M/2 through 90°. The fiducial marks 42X and 42Y are arranged such that they are illuminated with slit-like illumination light beams from the LSA light-transmission systems 35X and 35Y, while the reticle mark 3A of the reticle R is illuminated with light from the emissive cross mark 41 through the projection optical system PL.

Assume that the wafer stage 6 is driven to move the large fiducial mark plate 17 in the Y direction, while illumination light from the LSA light-transmission system 35Y in FIG. 1 is radiated, as a beam spot LSP1, on a portion near the fiducial mark 42Y, as shown in FIG. 2A. In this case, when the beam spot LSP1 is aligned with the fiducial mark 42Y in the Y direction, strong diffracted light is radiated from the fiducial mark 42Y in a predetermined direction. By detecting this diffracted light, the Y-coordinate of the fiducial mark 42Y can be detected with very high accuracy. Similarly, the X-coordinate of the fiducial mark 42X for the X direction can be detected with very high accuracy.

Figure 2B:
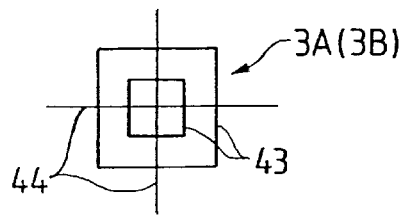
FIG. 2B is an enlarged plan view of a reticle mark 3A or 3B.

FIG. 2B shows the reticle mark 3A (having the same shape as that of the reticle mark 3B) in FIG. 1. The reticle mark 3A is constituted by a combination of a double rectangular pattern 43 and a cross pattern 44. The rectangular pattern 43 is used for detection performed by the TTR alignment system 5A in FIG. 1, whereas the cross pattern 44 is used to detect an aligned state between the emissive cross mark 41 in FIG. 2A and the reticle mark 3A.

Figure 3:
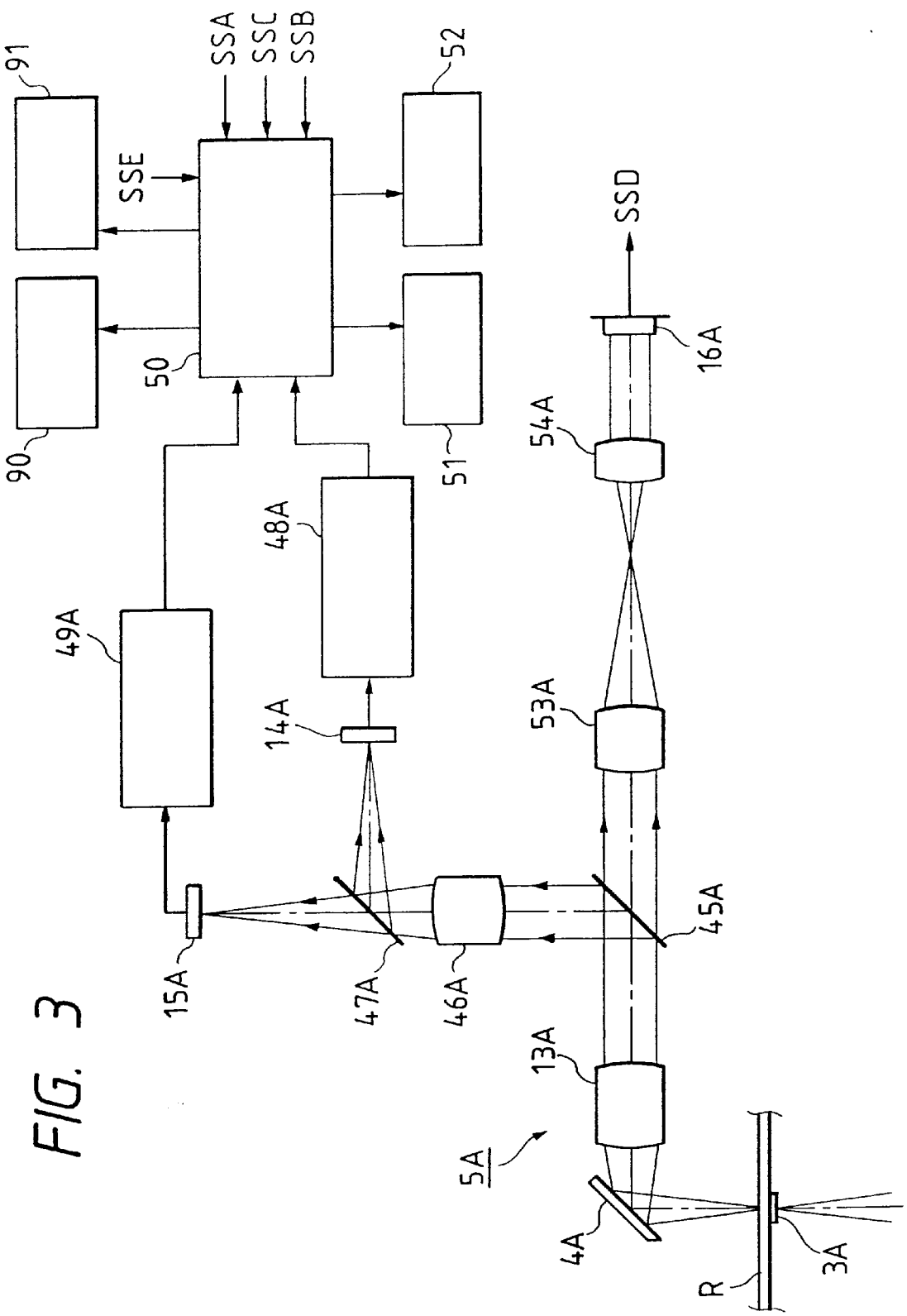
FIG. 3 is a block diagram showing the arrangement of a TTR alignment system 5A.

FIG. 3 shows the arrangement of the TTR alignment system 5A. Referring to FIG. 3, the mirror 4A is arranged above the reticle mark 3A of the reticle R to be inclined at 45°, and the objective lens 13A is arranged in the direction in which light propagating from the projection optical system PL and transmitted through the reticle mark 3A is reflected by the mirror 4A. The light beam transmitted through the objective lens 13A is split into two light beams by a half mirror 45A. The light beam reflected by the half mirror 45A is incident on a half mirror 47A through an imaging lens 46A. The two light beams split by the half mirror 47A are respectively incident on the imaging surfaces of the image pickup element 15A for the X direction and of the image pickup element 14A for the Y direction, both of which are constituted by charge-coupled devices (CCDs). The imaging surfaces of the image pickup elements 15A and 14A are conjugate to the surface, of the reticle R, on which the reticle mark 3A is formed. Therefore, the imaging surfaces of the image pickup elements 15A and 14A are also conjugate to the mark-formed surface of the large fiducial mark plate 17. The main scanning (horizontal scanning line) direction of the image pickup element 15A for the X direction is perpendicular to the X mark of the reticle mark 3A. The main scanning line direction of the image pickup element 14A is perpendicular to the Y mark of the reticle mark 3A.

Figure 4A:
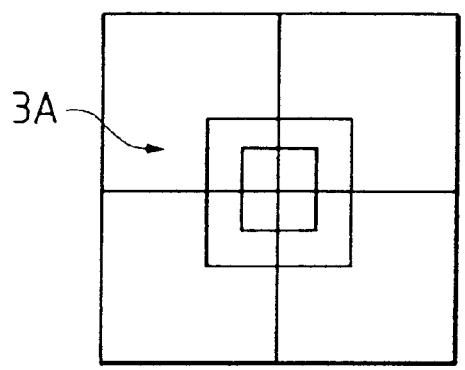
FIG. 4A is a plan view of a reticle mark 3A.
Figure 4B:
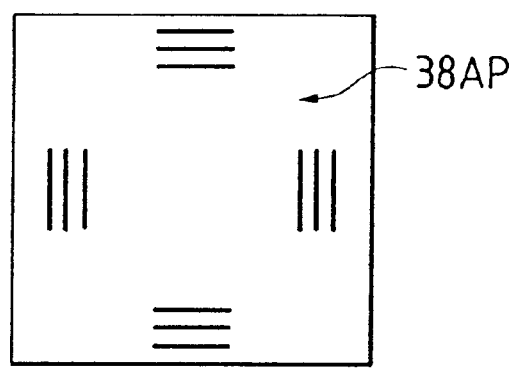
FIG. 4B is a plan view of an image 38AP of a fiducial mark 38A.
Figure 4C:
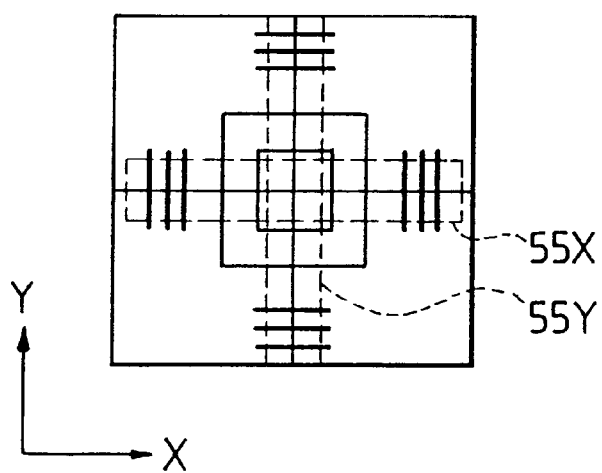
FIG. 4C is a plan view of an observation screen of the TTR alignment system 5A.

In this case, when the large fiducial mark plate 17 in FIG. 1 is moved, and the reticle mark 3A in FIG. 4A is substantially superimposed on a conjugate image 38AP of the fiducial mark 38A of the large fiducial mark plate 17 in FIG. 4B, the image shown in FIG. 4C is formed on the imaging surfaces of the image pickup elements 15A and 14A. In this case, the image pickup element 15A for the X direction supplies an imaging signal corresponding to a rectangular area 55X in the X direction in FIG. 4C to an image processing circuit 49A in FIG. 3. The image pickup element 14A for the Y direction supplies an imaging signal corresponding to a rectangular area 55Y in the Y direction in FIG. 4C to an image processing circuit 48A in FIG. 3. The image processing circuit 49A obtains the positional offset amount of the reticle mark 3A in the X direction with respect to the conjugate image 38AP of the fiducial mark 38A. The image processing circuit 48A obtains the positional offset amount of the reticle mark 3A in the Y direction with respect to the conjugate image 38AP of the fiducial mark 38A. The positional offset amounts in the X and Y directions are supplied to a main control system 50.

The main control system 50 controls the positional offset amounts of the reticle mark 3A with respect to the conjugate image 38AP of the fiducial mark 38A through a driving system 51 for the reticle stage 2 to be predetermined values or less. In addition, the main control system 50 positions the wafer stage 6 through a driving system 52 for the wafer stage 6 on the basis of coordinates measured by the laser interferometers 19X, 20x, and 21Y. The mirror 4A and the objective lens 13A can be moved two-dimensionally within a plane parallel to the surface of the reticle R. The main control system 50 controls the movement of the mirror 4A and the objective lens 13A through a driving system 90.

Referring to FIG. 3, the light beam transmitted through the half mirror 45A is incident on the light-receiving surface of the light-receiving element 16A, constituted by a photomultiplier or the like, through relay lenses 53A and 54A. The light-receiving surface of the light-receiving element 16A is conjugate to the pupil plane of the projection optical system PL. When the emissive cross mark 41 of the large fiducial mark plate 17 in FIG. 2A is located at a position substantially conjugate to the reticle mark 3A, a light beam radiated from the emissive cross mark 41 and transmitted through the projection optical system PL and a light-transmitting portion around the reticle mark 3A is photoelectrically converted by the light-receiving element 16a.

The light-receiving element 16A detects the amount of transmitted light which changes when a conjugate image of the emissive cross mark 41 scans the reticle mark 3A (or 3B), and generates a photoelectrically converted signal SSD in accordance with the detected transmitted light amount. This photoelectrically converted signal SSD is processed as follows. The signal is sampled in synchronism with up/down pulses (for example, one pulse for a moving amount of 0.01 $\mu$m) output from the laser interferometers 19X and 21Y upon movement of the wafer stage 6 in FIG. 1. Each sample signal is converted into digital data. Each digital data is then stored in a memory. When the photoelectrically converted signal SSD is processed, the coordinates (X,Y), of the wafer stage 6, at which a conjugate image of the emissive cross mark 41 is aligned with the reticle mark 3A (or 3B) can be obtained. Note that the TTR alignment system 5B in FIG. 1 has the same arrangement as that shown in FIG. 3, and the main control system 50 and driving systems 51 and 52 are commonly used. The main control system 50 controls the movement of the mirror 4B and the objective lens 13B through a driving system 91.

Figure 5:
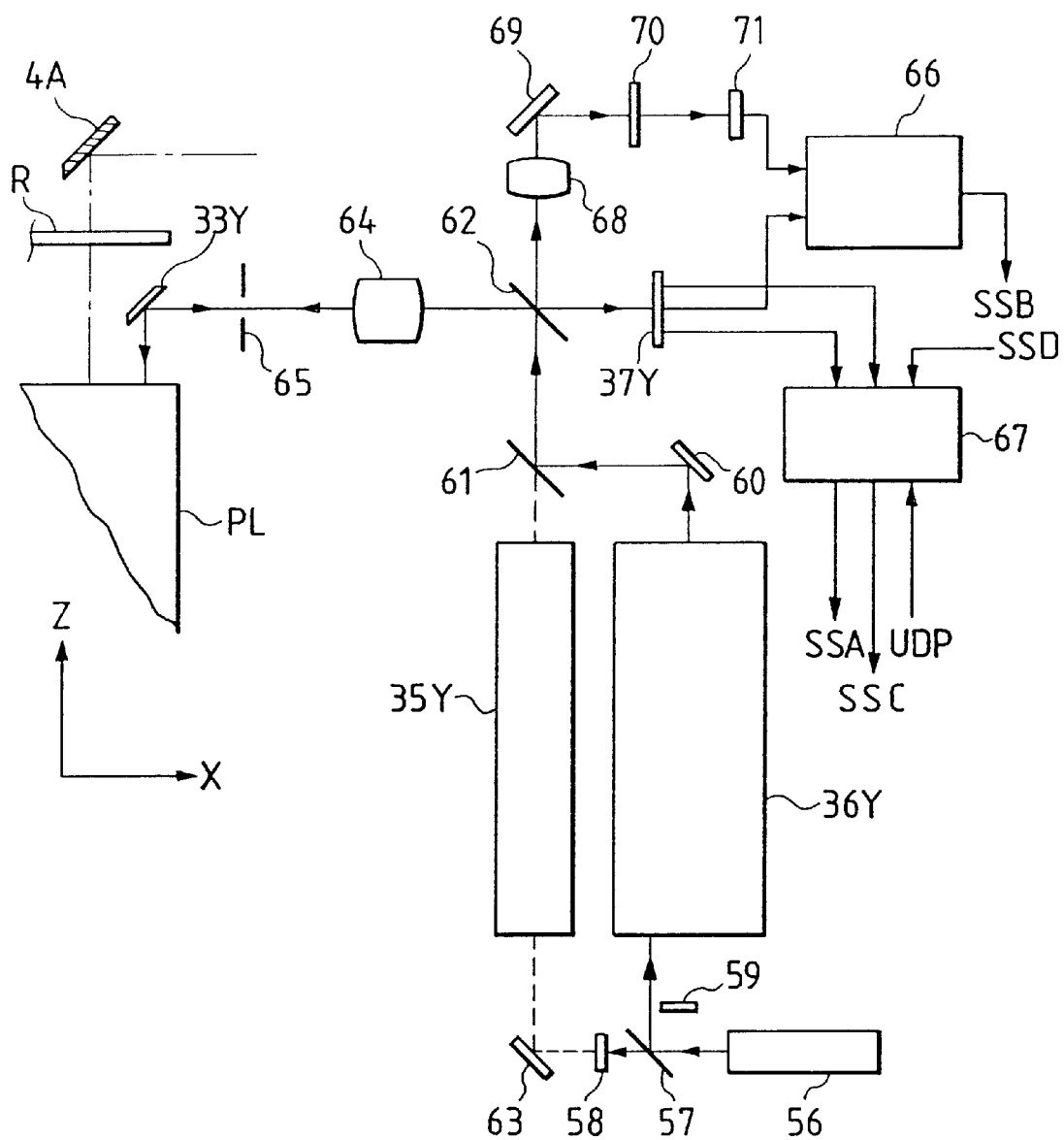
FIG. 5 is a block diagram showing the arrangement of a TTL wafer alignment system.

FIG. 5 shows the arrangement of the TTL wafer alignment system for the Y direction in FIG. 1. Referring to FIG. 5, a red laser beam from a He-Ne laser source 56 is used as mark illumination light. Since the photosensitivity of a resist layer on the wafer W with respect to a red laser beam is weak, a wafer mark near each shot area of the wafer W can be detected by using the red laser beam even while an exposure is performed with respect to the wafer W. In addition, in this TTL wafer alignment system, the two alignment systems based on different mark detection principles and constituted by the LSA light-transmission system 35Y and the LIA light-transmission system 36Y are incorporated, and the two alignment systems can be selectively used. Such an arrangement is disclosed in detail in U.S. Pat. No. 5,151,750, and hence will be briefly described here.

The red laser beam from the He—Ne laser source 56 is split by a beam splitter 57. The two split laser beams propagate toward shutters 58 and 59 which are alternately opened and closed. In FIG. 5, the shutter 58 is closed, but the shutter 59 is open. The laser beam passing through an optical path opened by the shutter 59 is incident on the light-transmission system 36Y of the LIA (two light beam interference alignment) scheme. The LIA light-transmission system 36Y splits the supplied laser beam into two laser beams and outputs the two laser beams upon setting a predetermined frequency difference therebetween using an acousto-optic modulation element or the like. Referring to FIG. 5, the two laser beams emerging from the LIA light-transmission system 36Y are aligned parallel to each other in a direction perpendicular to the surface of FIG. 5.

The two laser beams are reflected by a mirror 60 and a half mirror 61. Thereafter, each laser beam is split into two light beams by a beam splitter 62. The two laser beams reflected by the beam splitter 62 cross each other at an aperture portion of a stop 65 on a plane conjugate to the wafer W by an objective lens 64. The two laser beams transmitted through the stop 65 are reflected by the mirror 33Y to be incident on the projection optical system PL. For example, the two laser beams emerging from the projection optical system PL cross each other again at a position near the fiducial mark 40Y for interference between two beams, formed on the large fiducial mark plate 17 in FIG. 2. In the area where these two laser beams cross each other, one-dimensional interference fringes are formed. The interference fringes flow in the pitch direction (the Y direction in this case) of the interference fringes at a speed corresponding to the frequency difference between the two laser beams. In this case, the fiducial mark 40Y is a diffraction grating parallel to the interference fringes, and interference beat light whose intensity changes at a beat frequency corresponding to the frequency difference between the two laser beams is reflected from the fiducial mark 40Y.

If the pitch of the diffraction grating of the fiducial mark 40Y and the pitch of the interference fringes are set to have a predetermined relationship, the resulting interference beat light beams are reflected by the large fiducial mark plate 17 vertically upward and return to the beam splitter 62 along the two laser beam paths through the projection optical system PL, the mirror 33Y, the stop 65, and the objective lens 64 in FIG. 5. The interference beat light beams transmitted through the beam splitter 62 are incident on the light-receiving element 37Y. The light-receiving surface of the light-receiving element 37Y is arranged on a plane almost conjugate to the pupil plane of the projection optical system PL. The light-receiving element 37Y is constituted by a plurality of photoelectric conversion elements (photodiodes and the like) separated from each other. Interference beat light is received by a photoelectric conversion element located in the center of the light-receiving element 37Y (in the center of the surface conjugate to the pupil plane of the projection optical system PL). The obtained photoelectrically converted signal becomes a sinusoidal AC signal having the same frequency as the beat frequency. This AC signal is supplied to a phase difference measuring circuit 66.

The two laser beams transmitted through the beam splitter 62 become parallel light beams and cross each other on a transmission type fiducial grating plate 70 through an inverse Fourier transform lens 68 and a mirror 69. Therefore, one-dimensional interference fringes are formed on the fiducial grating plate 70, and these interference fringes flow in one direction at a speed corresponding to the beat frequency. An interference light beam generated by ±1st-order diffracted light generated parallel from the fiducial grating plate 70 or an interference light beam generated by 0th-order light and 2nd-order diffracted light is incident on a light-receiving element 71. The intensity of such an interference light beam also changes in the form of a sine-wave at the same frequency as the beat frequency. The light-receiving element 71 photoelectrically converts the interference light beam to generate an AC signal having the same frequency as the beat frequency. This AC signal is supplied to the phase difference measuring circuit 66.

The phase difference measuring circuit 66 obtains a phase difference $\Delta\phi(-180°<\phi\leq 180°)$ between the AC signal from the light-receiving element 71 and the AC signal from the photoelectric conversion element in the center of the light-receiving element 37Y, and supplies information SSB indicating the positional offset amount of the fiducial mark 40Y on the large fiducial mark plate 17 in the Y direction, which information corresponds to the phase difference $\Delta\phi$, to the main control system 50 in FIG. 3. For example, the resolution of the positional offset amount is about 0.01 $\mu$m. The main control system 50 in FIG. 3 can servo-lock the wafer stage 6 to cause the fiducial mark 40Y of the large fiducial mark plate 17 to always have a predetermined relationship with the fiducial grating plate 70 by servo-controlling the driving system 52 for the wafer stage 6 on the basis of the positional offset information SSB from the TTL alignment system of the LIA scheme.

Similarly, by using the LIA light-transmission system 36x in FIG. 1, the wafer stage 6 can be servo-locked to cause the fiducial mark 40X of the large fiducial mark plate 17 in FIG. 2A to always have a predetermined relationship with the fiducial grating plate for the X direction.

Referring to FIG. 5 again, when the shutter 58 is opened, and the shutter 59 is closed, a laser beam is incident on the LSA (laser step alignment) light-transmission system 35Y. As disclosed in U.S. Pat. No. 5,171,750, the laser step alignment scheme is a scheme of scanning a mark with respect to slit-like laser spot light extending in a direction perpendicular to a mark detection direction. Signals obtained by photoelectrically converting diffracted light or scattered light generated from the mark are sampled in synchronism with up/down pulses which are generated by the laser interferometers 19X and 21Y when the wafer stage 6 is moved to scan the mark.

The laser beam incident on the LSA light-transmission system 35Y is formed into a slit-like beam having a cross-section extending in one direction at the converging point owing to the effects of a beam expander and a cylindrical lens which are incorporated in the light-transmission system 35Y. The laser beam having a slit-like cross-section and emerging from the LSA light-transmission system 35Y is incident on the projection optical system PL through the half mirror 61, the beam splitter 62, the objective lens 64, the stop 65, and the mirror 33Y. The stop 65 is conjugate to the surface (the surface of the wafer W) of the large fiducial mark plate 17 at the wavelength of a He—Ne laser beam, and the laser beam is focused on the aperture portion of the stop 65 in the form of a slit. The beam spot LSP1 of the laser beam generated by the LSA light-transmission system 35Y in FIG. 5 and emerging from the projection optical system PL is formed into a slit-like shape extending in the X direction at a position, within the exposure area of the projection optical system PL, at which the beam spot LSP1 is at rest, as shown in FIG. 2A.

In this case, when the wafer stage 6 is scanned in, the Y direction, and the slit scanning fiducial mark 42Y on the large fiducial mark plate 17 crosses the beam spot LSP1, diffracted light or scattered light is generated from the fiducial mark 42Y. In FIG. 5, the generated reflected light such as diffracted light or scattered light is incident on the light-receiving element 37Y through the projection optical system PL, the mirror 33Y, the stop 65, the objective lens 64, and the beam splitter 62. The reflected light from the fiducial mark 42Y is photoelectrically converted by the photoelectric conversion elements around the photoelectric conversion element in the center of the light-receiving element 37Y. The photoelectrically converted signal is supplied to an LSA processing circuit 67. The LSA processing circuit 67 samples the photoelectrically converted signal in response to an up/down pulse signal UDP from the laser interferometer 21Y for the wafer stage 6, converts it into a digital signal, and writes it in a memory. The LSA processing circuit 67 calculates the Y-coordinate of the wafer stage 6, at which the central point of the beam spot LSP1 in the Y direction in FIG. 2A is accurately aligned with the central point of the fiducial mark 42Y in the Y direction, on the basis of the waveform of the signal read out from the memory. The LSA processing circuit 67 then supplies the Y-coordinate, as mark position information SSA, to the main control system 50 in FIG. 3. The mark position information SSA is also used to drive/control the driving system 52 for the wafer stage 6.

Referring to FIG. 5, the LSA processing circuit 67 incorporates a memory for storing data obtained by sampling the photoelectrically converted signal SSD from the release lens 54A in FIG. 3 in synchronism with the up/down pulse UDP, and a circuit for processing a signal in the memory at high speed. The coordinates, of the wafer stage 6, at which the reticle mark 3A is aligned with the conjugate image of the emissive cross mark 41 in FIG. 2A are calculated as projection position information SSC for the reticle mark 3A. This projection position information SSC is supplied to the main control system 50. Note that the alignment system including the LSA light-transmission system 35X and the LIA light-transmission system 36X in FIG. 1 has the same arrangement as that shown in FIG. 5.

Figure 6:
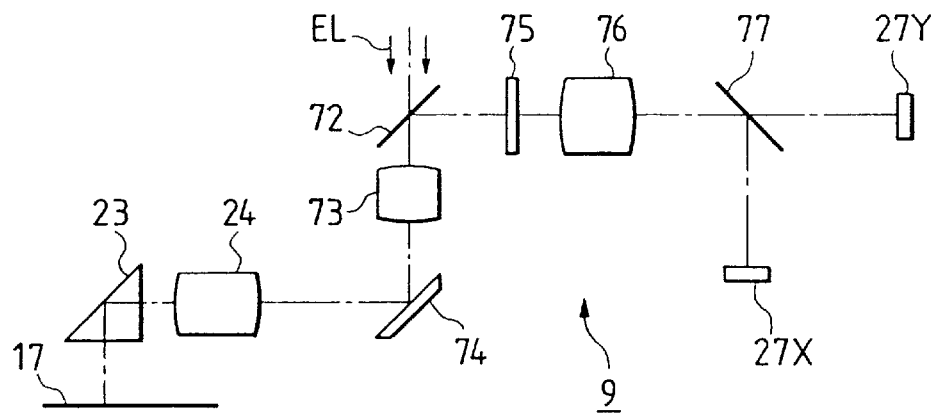
FIG. 6 is a block diagram showing the arrangement of an off-axis wafer alignment system 9.

FIG. 6 shows the arrangement of the off-axis wafer alignment system 9. Referring to FIG. 6, illumination light EL illuminates the surface of the large fiducial mark plate 17 (or the surface of the wafer W) through a half mirror 72, a lens system 73, a mirror 74, the objective lens 24, and the reflecting prism 23. The light reflected by the surface of the large fiducial mark plate 17 is incident on the half mirror 72 through the prism mirror 23, the objective lens 24, the mirror 74, and the lens system 73. The light reflected by the half mirror 72 is incident on an index plate 75. The surface of the index plate 75 is conjugate to the surface of the large fiducial mark plate 17, and an image of the fiducial mark 39 in FIG. 2A is formed on the index plate 75 when a base line amount is measured. The illumination light EL has a wavelength of about 300 nm at which the photosensitivity of a resist layer is very low.

Figure 7:
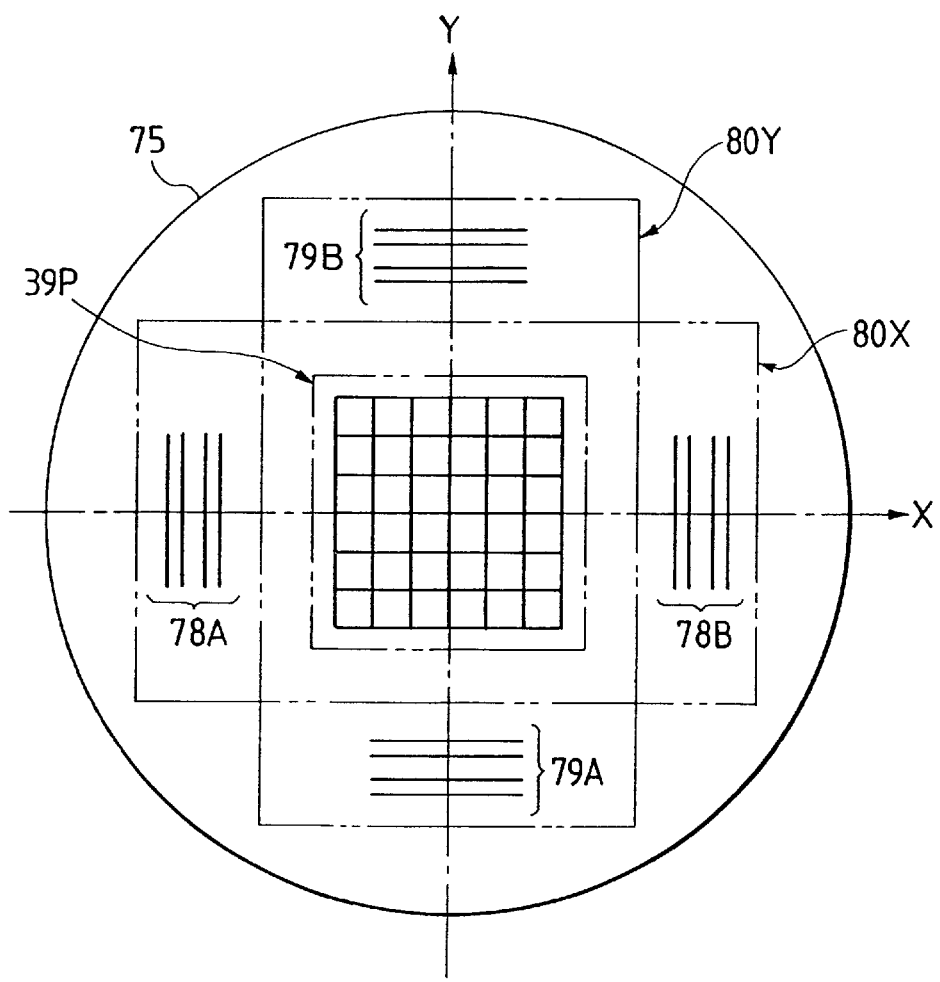
FIG. 7 is a view showing an index plate 75 of the wafer alignment system 9.

As shown in FIG. 7, the index plate 75 has index marks 78A and 78B, each constituted by four light-shielding lines arranged at predetermined intervals in the X direction and formed on a transparent glass plate, and index marks 79A and 79B, each constituted by four light-shielding lines arranged at predetermined intervals in the Y direction and formed on the transparent glass plate. Referring to FIG. 7, an image 39P of the fiducial mark 39 on the large fiducial mark plate 17 is formed in the center of the index plate 75. The X-direction positional offset amounts of the image 39P with respect to the index marks 78A and 78B and the Y-direction positional offset amounts of the image 39P with respect to the index marks 79A and 79B indicate the positional offset amount of the fiducial mark 39 with respect to the optical axis of the wafer alignment system 9.

Referring to FIG. 6, images of the index marks on the index plate 75 and of the fiducial mark 39 on the large fiducial mark plate 17 (or a wafer mark on the wafer W) are formed on the imaging surfaces of the image pickup element 27X for the X direction and the image pickup element 27Y for the Y direction, both of which are constituted by CCDs or the like, through an imaging lens 76 and a half mirror 77. In this case, the imaging areas of the image pickup elements 27X and 27Y on the index plate 75 are in an area 80X in the X direction and an area 80Y in the Y direction in FIG. 7, respectively. In addition, the main scanning line (horizontal scanning line) directions of the image pickup elements 27X and 27Y are respectively set to directions conjugate to the X and Y directions in FIG. 7. When imaging signals from the image pickup elements 27X and 27Y are processed by a processing circuit (not shown), the positional offset amount of the index plate 75 with respect to the fiducial mark 39 of the large fiducial mark plate 17 (or the wafer mark of the wafer W) can be obtained. Information SSE indicating this positional offset amount is supplied to the main control system 50 in FIG. 3.

In the embodiment, the detection center of the off-axis wafer alignment system 9 on the index plate 75 in the X direction is set at the coordinates of the centers of the index marks 78A and 78B in the X direction in FIG. 7. However, the detection center may be set at the coordinate of the center of one index mark 78A in the X direction. The same applies to the detection center of the wafer alignment system 9 in the Y direction. Similarly, in the embodiment, the position of the image 39P of the fiducial mark 39 on the index plate 75 in the X direction is set to the average position of the detection positions of the respective line patterns of the image 39P in the X direction, and the position of the image 39P of the fiducial mark 39 in the Y direction is set to be the average position of the detection positions of the respective line patterns in the Y direction. Note that in calculating the base line amount of the wafer alignment system 9, the coordinates of these detection centers must be converted into the coordinates of the corresponding conjugate points on the wafer stage 6.

A method of positioning the wafer stage 6 of the projection exposure apparatus of the embodiment will be described next. According to a conventional projection exposure apparatus, the traveling direction of the wafer stage 6 is determined on the basis of the relative positions of the internal stationary mirrors of the laser interferometers 19X and 21X and the corresponding movable mirrors 18X and 18Y in FIG. 1, which positions are used as absolute coordinates. For this reason, if an error is included in the absolute coordinates due to air fluctuations, and coordinate measurement is performed at a position offset from the optical axis AX of the projection optical system PL, the yawing error of the wafer stage 6 increases. In addition, when a base line amount is to be measured, the wafer stage 6 must be moved. If measurement is repeated several times and the obtained values are averaged to improve the precision, the throughput decreases.

In contrast to this, in the embodiment, the traveling direction of the wafer stage 6 is set with reference to the large fiducial mark plate 17 in FIG. 1. More specifically, the reticle R is positioned with reference to the position, of the large fiducial mark plate 17, which is set when the base line amount of the off-axis wafer alignment system 9 is checked. In addition, the difference in measurement value between the laser interferometers 19X and 20X serving as yawing sensors is reset to 0.

Figure 8A:
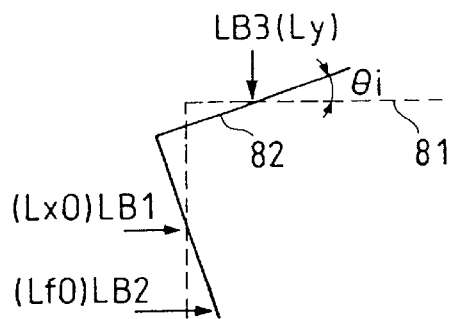
FIGS. 8A and 8B are views for explaining an operation of measuring the yawing error of a wafer stage in the embodiment.
Figure 8B:
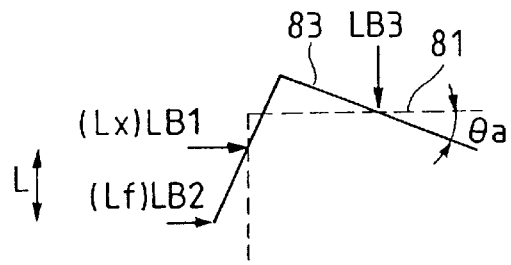

Errors in measurement of a base line amount (base line check) will be described in detail first with reference to FIGS. 8A to 8C. Referring to 8A, assume that the position of a pattern 81 indicated by the broken line is the fiducial mirror position of each of the movable mirrors 18X and 1BY in FIG. 1, and that the position of a pattern 82 indicated by the solid line is the actual position of each of the movable mirrors 18X and 18Y in an interferometer reset operation. Let θ be the inclination of the pattern 82 with respect to the pattern 81, i.e., the yawing error of the interferometer reset operation. Laser beams LB1 and LB2 from the laser interferometers 19X and 20X in FIG. 1 are incident on the movable mirror 18X, and a laser beam LB3 from the laser interferometer 21Y in FIG. 1 is incident on the movable mirror 18Y. Letting Lx0 and Lf0 be the coordinate values in the X direction measured by the laser interferometers 19X and 20 X, and Ly be the coordinate value in the Y direction measured by the laser interferometer 21Y, an initial coordinate value is set as follows:

$$Lx0=Lf0$$

Assume that the movable mirrors 18X and 18Y at the time of a base line check on the wafer alignment system 9, performed by moving the large fiducial mark plate 17 in FIG. 1, is indicated by a pattern 83, and the inclination of the pattern 83 with respect to the pattern 81, i.e., the yawing error, is represented by θa. Letting L be the distance between the laser beams LB1 and LB2 in the Y direction, and Lx and Lu be the coordinate values in the X direction measured by the laser interferometers 19X and 20X, the following equation is established:

$$Lf=(\theta a-\theta i)L+Lx$$

A difference (θa−θi)L between the coordinate values is stored, as an offset A, in the memory. With this operation, a state in which the coordinate value Lx measured by the laser interferometer 19X and the coordinate value Lf measured by the laser interferometer 20X satisfy (Lf=A+Lx), i.e., the yawing state of each of the movable mirrors 18X and 18Y at the time of a base line check, can be treated as a fiducial mirror position afterward.

Figure 8C:
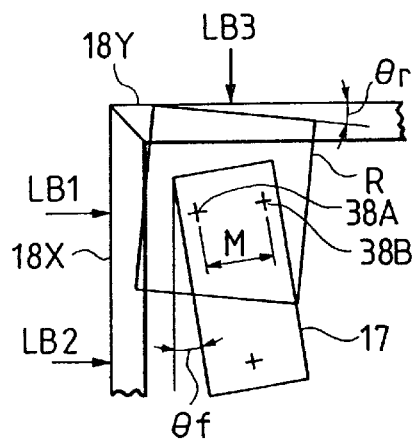
FIG. 8C is a view for explaining an operation of obtaining the rotational error of a reticle R with respect to the large fiducial mark plate 17.

FIG. 8C shows the relationship between the large fiducial mark plate 17 and the movable mirrors 18X and 18Y at the time of a base line check. As shown in FIG. 8C, the large fiducial mark plate 17 has a rotational error of an angle θf with respect to the movable mirror 18X owing to a mounting error. This rotational error θf can also be defined as the inclination of a straight line passing the centers of the two fiducial marks 38A and 38B of the large fiducial mark plate 17 with respect to the X axis defined by the movable mirrors 18X and 18Y.

When alignment of the reticle R is to be performed, the two fiducial marks 38A and 38B of the large fiducial mark plate 17 are located near the design conjugate points of the reticle marks 3A and 3B, as shown in FIG. 1. Since the fiducial marks 38A and 38B are illuminated with the illumination light IL from the bottom portions, as shown in FIG. 2A, peripheral portions of the reticle marks 3A and 3B on the reticle R are also illuminated with the illumination light IL. First, the position and rotation amount of the reticle R are set such that the reticle marks 3A and 3B are set in a predetermined state with respect to the internal fiducial positions of the TTR alignment systems 5A and 5B. In this state, the reticle stage 2 is fixed. In this case, two-axis photoelectric microscopes may be arranged in the TTR alignment systems 5A and 5B so that the positions of the reticle marks 3A and 3B may be measured by the photoelectric microscopes with a total of four axes.

However, owing to the inclination of a straight line connecting the fiducial positions of the TTR alignment systems 5A and 5B with respect to the coordinate axis defined by the movable mirrors 18X and 18Y, the reticle R has a rotational error of an angle θr with respect to the coordinate axis defined by the movable mirrors 18X and 18Y, as shown in FIG. 8C. The rotational error of and the magnification error of the projection optical system PL are obtained by using the TTR alignment systems 5A and 5B in FIG. 1.

As described above with reference to FIG. 4C, in the TTR alignment system 5A, an X-direction error RAX1 and a Y-direction error RAY between the conjugate image of the fiducial mark 38A and the reticle mark 3A are obtained. In the TTR alignment system 5B, an X-direction error RAX2 and a Y-direction error RAθ between the conjugate image of the fiducial mark 38B and the reticle mark 3B are obtained. Assume that the error RAX1 and the like are converted into values on the wafer stage 6. Letting M be the distance between the fiducial marks 38A and 38B, a rotational error Rr of the reticle R with respect to the fiducial marks 38A and 38B of the large fiducial mark plate 17 and a magnification error Rm of the projection optical system PL are given by $Rr=(RAθ-RAY)/M$ $Rm=(RAX2-RAX1)/M$ (1)

In this case, the rotational error θf of the large fiducial mark plate 17 with respect to the coordinate system defined by the movable mirrors 18X and 18Y is measured in advance and is stored as system error data. More specifically, in order to measure the rotational error θf, a Y-direction positional offset amount Y1 of the reticle mark 3B with respect to the fiducial mark 38B is measured by the TTR alignment system 5B in FIG. 1. The wafer stage 6 is then moved in the X direction, and a Y-direction positional offset amount Y2 of the reticle mark 3B with respect to the fiducial mark 38A is measured by the TTR alignment system 5B. Since the distance between the fiducial marks 38A and 38B is represented by M, the rotational error of is expressed as follows:

$θf=(Y1-Y2)/M$

Referring to FIG. 8C, when the rotational error θf and the rotational error Rr based on equations (1) are used, the rotational error θr of the reticle R with respect to the coordinate system defined by the movable mirrors 18X and 18Y is expressed as $θr=Rr-θf$ Since the traveling direction of the wafer stage 6 can be determined by the angles of the reflecting surfaces of the movable mirrors 18X and 18Y, the rotational error θr can be considered as the rotational error of the reticle R with respect to the traveling direction of the wafer stage 6. Assume that orthogonality correction and angle correction are performed with respect to the movable mirrors 18X and 18Y prior to this measurement. The traveling direction of the wafer stage 6 is set in accordance with a coordinate system obtained by correcting the coordinate system of the movable mirrors 18X and 18Y by an amount corresponding to the rotational error θf in a software manner.

Figure 9:
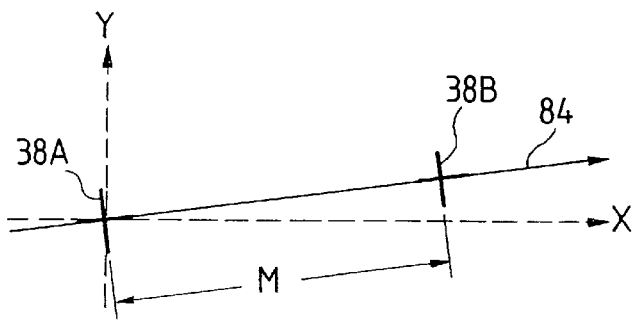
FIG. 9 is a view for explaining traveling of the wafer stage after correction.

Provided that the coordinate system (X,Y) indicated by the broken lines shown in FIG. 9 is the coordinate system determined by the movable mirrors 18X and 18Y, the wafer stage 6 travels along the coordinate system having the X axis defined by a straight line 84 connecting the fiducial marks 38A and 38B on the large fiducial mark plate 17.

Figure 10:
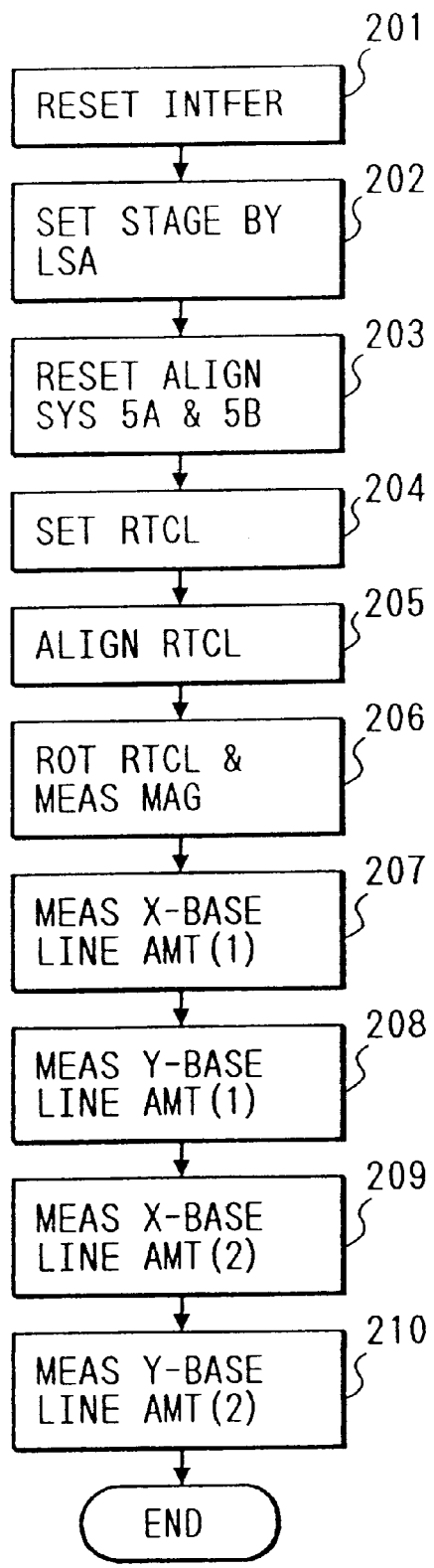
FIG. 10 is a flow chart showing a base line check operation in the embodiment.

An operation of performing alignment of the reticle R and a base line check in the embodiment will be described next with reference to FIG. 10.

In step 201, the laser interferometers 19X, 20X, and 21Y are reset. Consider this operation in the X direction. If there is a difference (dead path) between the length of an optical path to the internal stationary mirror of the laser interferometer 19X and that of the movable mirror 18X in the reset operation, a change in atmospheric gas temperature alone can change the measurement values, resulting in measurement errors. For this reason, the distance to a position where no dead path is present is obtained, and correction is performed such that the measurement values obtained by the laser interferometers 19X, 20X, and 21Y become zero as interferometer values with respect to temperature. With this operation, the measurement errors due to a change in temperature can be minimized.

In step 202, positioning of the wafer stage 6 is performed by the laser step alignment (LSA) scheme. More specifically, beam spots from the LSA light-transmission systems 35X and 35Y are scanned by the slit scanning fiducial marks 42x and 42Y in FIG. 2A to measure the X-coordinate of the fiducial mark 42X and the Y-coordinate of the fiducial mark 42Y. Thereafter, the large fiducial mark plate 17 is positioned to the position for a base line check with reference to the positions of the fiducial marks 42X and 42Y. In the laser step alignment scheme, since the positional displacement and the like of a beam spot is small, variations in the coordinates of the wafer stage 6 due to setting errors in an interferometer reset operation and in the TTR alignment systems 5A and 5B can be suppressed in a positioning operation. Therefore, a positioning operation can be performed with high precision and stability.

In step 203, positioning (reset operation) of the TTR alignment systems 5A and 5B is performed. Upon resetting the alignment systems 5A and 5B, the positional relationship between the wafer stage 6 and the image processing areas 55X and 55Y in FIG. 4C may change. In order to prevent this, two-axis photoelectric microscopes may be respectively arranged in the alignment systems 5A and 5B, and positioning of the alignment systems 5A and 5B may be performed with high precision with reference to the fiducial marks 38A and 38B on the large fiducial mark plate 17.

Note that if the alignment systems 5A and 5B are used as stationary systems, step 203 is omitted.

After the reticle R is set on the reticle stage 2 (step 204), alignment (positioning) of the reticle R is performed with reference to the fiducial marks 38A and 38B of the large fiducial mark plate 17, thus fixing the reticle R (step 205). The rotational error Rr of the reticle R with reference to the fiducial marks 38A and 38B of the large fiducial mark plate 17, and the magnification error Rm of the projection optical system PL are calculated according to equations (1) (step 206).

In step 207, the X-direction base line amount of the off-axis wafer alignment system 9 and the X-direction base line amount of the TTL wafer alignment system including the LIA light-transmission system 36X are measured. More specifically, let RAX1 and RAX2 be the positional offset amounts obtained by measuring the positions of the fiducial marks 38A and 38B of the large fiducial mark plate 17 in the X direction using the TTR alignment systems 5A and 5B, respectively; FIAX be the positional offset amount obtained by measuring the position of the fiducial mark 39 of the large fiducial mark plate 17 in the X direction using the wafer alignment system 9; and LIXA be the positional offset amount obtained by measuring the position of the two-beam interference fiducial mark 40X of the large fiducial mark plate 17 using a laser beam from the LIA light-transmission system 36X. In this case, an X-direction base line amount BE1x of the wafer alignment system 9 and an X-direction base line amount BE2x of the alignment system including the LIA light-transmission system 36X are obtained as follows by using the magnification error Rm according to equations (1). Note that on the large fiducial mark plate 17, the difference between the middle point between the fiducial marks 38A and 38B and the center of the fiducial mark 39 in the X direction is represented by L10, and the difference between the middle point between the fiducial marks 38A and 38B and the fiducial mark 40X in the X direction is represented by L20.

$$BE1x = L10 + FIAX - (RAX2 - Rm \times M/2)$$

$$BE2x = L20 + LIXA - (RAX2 - Rm \times M/2) \qquad (2)$$

In this case, the wafer stage 6 is servo-controlled to be fixed in the X direction such that the two-beam interference fiducial mark 40X is set at a predetermined position in the X direction, and is also servo-controlled to be fixed in the Y direction such that the position of the two-beam interference fiducial mark 40Y is set at a predetermined position in the Y direction. The same operation is performed in step 208. An average value Lx of the measurement values obtained by the laser interferometer 19X and an average value Lf of the measurement values obtained by the laser interferometer 20X in the base line check operation are obtained, and a difference A (=Lf−Lx) therebetween is obtained. This value is used as a fiducial value when the yawing error of the wafer stage 6 is obtained.

In step 208, the Y-direction base line amount of the off-axis wafer alignment system 9 and the Y-direction base line amount of the TTL alignment system including the LIA light-transmission system 36Y are measured. Similar to step 207, let RAY and RAθ be the positional offset amounts obtained by measuring the positions of the fiducial marks 38A and 38B in the Y direction using the TTR alignment systems 5A and 5B, respectively; FIAY be the positional offset amount obtained by measuring the position of the objective lens 29 in the Y direction using the wafer alignment system 9; and LIAY be the positional offset amount obtained by measuring the position of the fiducial mark 40Y using a laser beam from the LIA light-transmission system 36Y. In this case, a Y-direction base line amount BE1y of the wafer alignment system 9 and a Y-direction base line amount BE2y of the alignment system including the LIA light-transmission system 36Y are obtained as follows by using the rotational error Rr according to equations (1). Note that on the large fiducial mark plate 17, the difference between the middle point between the fiducial marks 38A and 38B and the center of the fiducial mark 39 in the Y direction is represented by L11, and the difference between the middle point between the fiducial marks 38A and 38B and the fiducial mark 40Y in the Y direction is represented by L21.

$$BE1y = L11 + FIAY - (RA\theta - Rr \times M/2)$$

$$BE2y = L21 + LIAY - (RA\theta - Rr \times M/2) \qquad (3)$$

In step 209, the X-direction base line amount of the TTL wafer alignment system of the laser step alignment scheme, including the LSA light-transmission system 35X, is measured. More specifically, when the wafer stage 6 is driven to scan a portion near the reticle mark 3A with the emissive cross mark 41 of the large fiducial mark plate 17 in the X direction, a positional offset amount ISSX with respect to the design value of the position where an image of the emissive cross mark 41 is aligned with the reticle mark 3A in the X direction, and a positional offset amount LSAX with respect to the design value of the position where the slit scanning fiducial mark 42X is aligned with a beam spot from the LSA light-transmission system 35X are obtained.

In order to correct an Abbe's error, an Abbe's error Ab is defined by the following equation:

$$Ab = Lf - Lx - A$$

where Lx is the measurement value obtained by the laser interferometer 19X, Lf is the measurement value obtained by the laser interferometer 20X, and A is the value (Lf−Fx) obtained in step 207.

Letting AbX be the X-direction difference between the values obtained by averaging the Abbe's errors Ab before and after scanning of the wafer stage 6 for a predetermined period of time; L30 be the X-direction difference between the emissive cross mark 41 and the fiducial mark 42X; ALSA be the Y-direction difference between the position of the emissive cross mark 41 and the position of a beam spot from the LSA light-transmission system 35X; and FR be the distance between the laser beams LB1 and LB2 in the Y direction, an X-direction base line amount BE3x of the wafer alignment system of the TTL and laser step alignment schemes is represented by $$BE3x = L30 + LSAX - AbX \times ALSA/FR - (ISSX - Rm \times M/2) \qquad (4)$$

Similarly, the wafer stage 6 is driven to scan a portion near the reticle mark 3A with the emissive cross mark 41 of the large fiducial mark plate 17 in the Y direction. A Y-direction base line amount BE3y of the wafer alignment system of the TTL and laser step alignment schemes is obtained as follows by using a positional offset amount ISSY with respect to the design value of the position where an image of the emissive cross mark 41 is aligned with the reticle mark 3A in the Y direction and a positional offset amount LSAY with respect to the design value of the position where the slit scanning fiducial mark 42Y is aligned with a beam spot from the LSA light-transmission-system 35Y. Note that the difference between the position of the emissive cross mark 41 and the position of the fiducial mark 42Y in the Y direction is represented by L31. In this case, since no Abbe's error is present, a simple equation can be used. Note that if the marks are arranged in the X direction under the same conditions as those in the Y direction, no Abbe's error needs to be corrected.

$$BE3y = L31 + LSAY - (ISSY - Rr \times M/2) \qquad (5)$$

In this manner, the base line amounts of the wafer alignment system 9, the LSA wafer alignment system including the LSA light-transmission systems 35X and 35Y, and the two-beam interference wafer alignment system including the LIA light-transmission systems 36X and 36Y in FIG. 1 are obtained. Referring to FIG. 10, if the reticle R is replaced with a new one, an operation is started from step 204. When reticle alignment is to be performed, an operation is started from step 205. When only a base line check is to be performed, an operation is started from step 206. In the above description, steps 206 and 208 are independently executed. However, rotation/magnification measurement and base line measurement may be simultaneously performed to calculate a rotation error, a magnification error, and base line amounts (equations (1) to (4)) at once.

An operation of performing alignment of the wafer W by using the off-axis wafer alignment system 9 in FIG. 1 will be described next with reference to FIG. 11.

Figure 11:
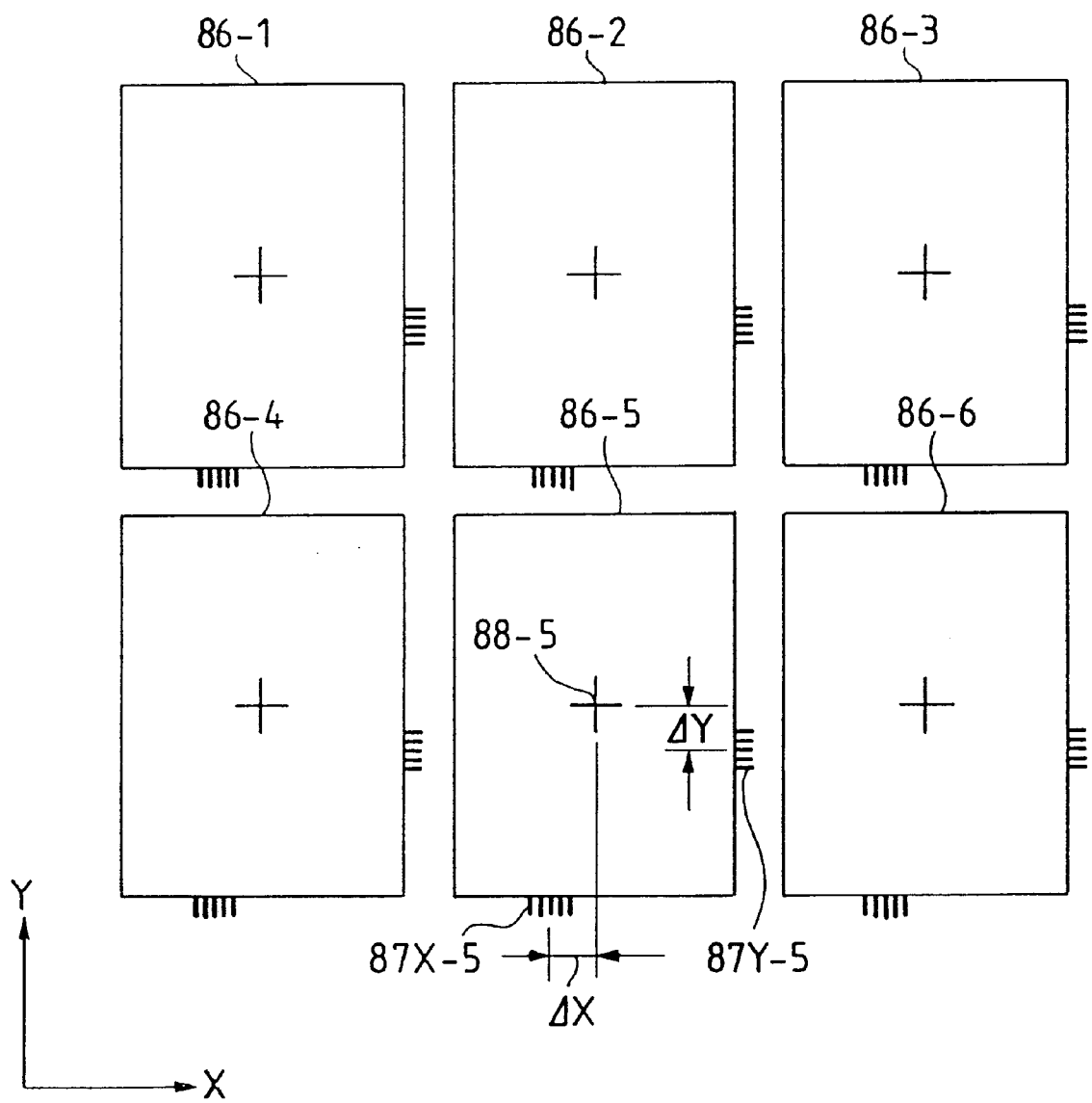
FIG. 11 is an enlarged plan view showing the arrangement of shot areas on a wafer W in the embodiment.

FIG. 11 shows wafer marks respectively formed in shot areas 86-1, 86-2, . . . on the wafer W. Referring to FIG. 12, for example, with regard to a shot area 86-5, an X-direction difference ΔX between a wafer mark 87X-5 arranged on a side of the shot area in the X direction and a center 88-5 of the shot area, and an y-direction difference ΔY between a wafer mark 87Y-5 arranged on a side of the shot area in the Y direction and the center 88-5 of the shot area are set to predetermined design values.

Referring to FIG. 1, the wafer stage 6 is driven to move the shot area 86-5 of the wafer W to a position below the wafer alignment system 9. In this state, in the wafer alignment system 9, an image of the wafer mark 87X-5 is interposed between the index marks 78A and 78B of the index plate 75 in FIG. 7, thus measuring the X-coordinate of the wafer mark 87X-5. Thereafter, an image of the wafer mark 87Y-5 is interposed between the index marks 79A and 79B of the index plate 75 in FIG. 7 to measure the Y-coordinate of the wafer mark 87Y-5. When a pattern of the reticle R is to be exposed on the shot area 86-5 on the wafer W, the wafer stage 6 is driven to the coordinates determined on the basis of the coordinates of the wafer marks 87X-5 and 87Y-5, the design differences ΔX and ΔY, and the base line amounts of the wafer alignment system 9 which are measured in accordance with the above-described procedure. As a result, the center 88-5 of the shot area 86-5 is aligned with a conjugate point of the center of the reticle R, i.e., the optical axis ΔX of the projection optical system PL. With this operation, exposure can be performed with excellent superposition precision.

An operation of an arrangement for allowing the TTR alignment systems 5A and 5B in FIG. 1 to move in the X direction will be described next.

Figure 12A:
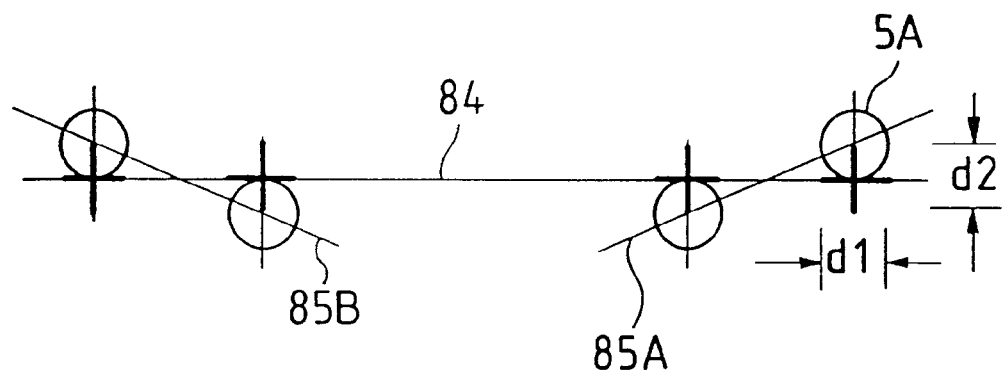
FIGS. 12A and 12B are views for explaining an arrangement for allowing the TTR alignment systems 5A and 5B to move.
Figure 12B:
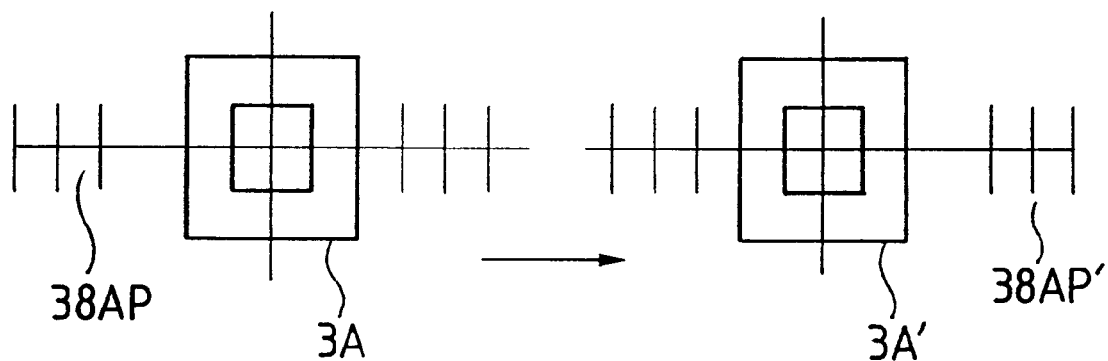

Assume that the traveling direction of the wafer stage 6, set after correction is performed on the basis the fiducial marks 38A and 38B of the large fiducial mark plate 17 in FIG. 1, is parallel to the straight line 84 in FIG. 12A. In addition, assume that the tracks of movement of the TTR alignment systems 5A and 5B are represented by 85A and 85B, and for example, the alignment system 5A is fixed at two points on the track 85A. In this case, both Y- and X-direction positioning error widths d2 and d1 of the alignment system 5A with respect to the straight line 84 are set to be several μm or less. As shown in FIG. 12B, the X-direction offset amount of the reticle mark 3A observed by the TTR alignment system 5A at the first position on the track 85A with respect to the image 38AP of the fiducial mark may differ from the X-direction offset amount of a reticle mark 3A' observed by the TTR alignment system 5A at the second position on the track 85A with respect to an image 38AP' of the fiducial mark. If, however, both the positioning error widths d1 and d2 are smaller than several μm, the positional offset amounts in FIG. 12B can be accurately measured.

In the above-described embodiment, the fiducial mark 39 of the large fiducial mark plate 17 is arranged on the perpendicular bisector defined by the fiducial marks 38A and 38B. However, for example, the fiducial mark 39 may be arranged on a straight line connecting the fiducial mark 38A and the fiducial mark 38B.

An operation of the projection exposure apparatus shown in FIG. 1 will be described next with reference to FIG. 13.

In this operation, after the reticle R is replaced with a new reticle R, a pattern of the reticle R is sequentially exposed on, e.g., several hundred wafers.

Figure 13:
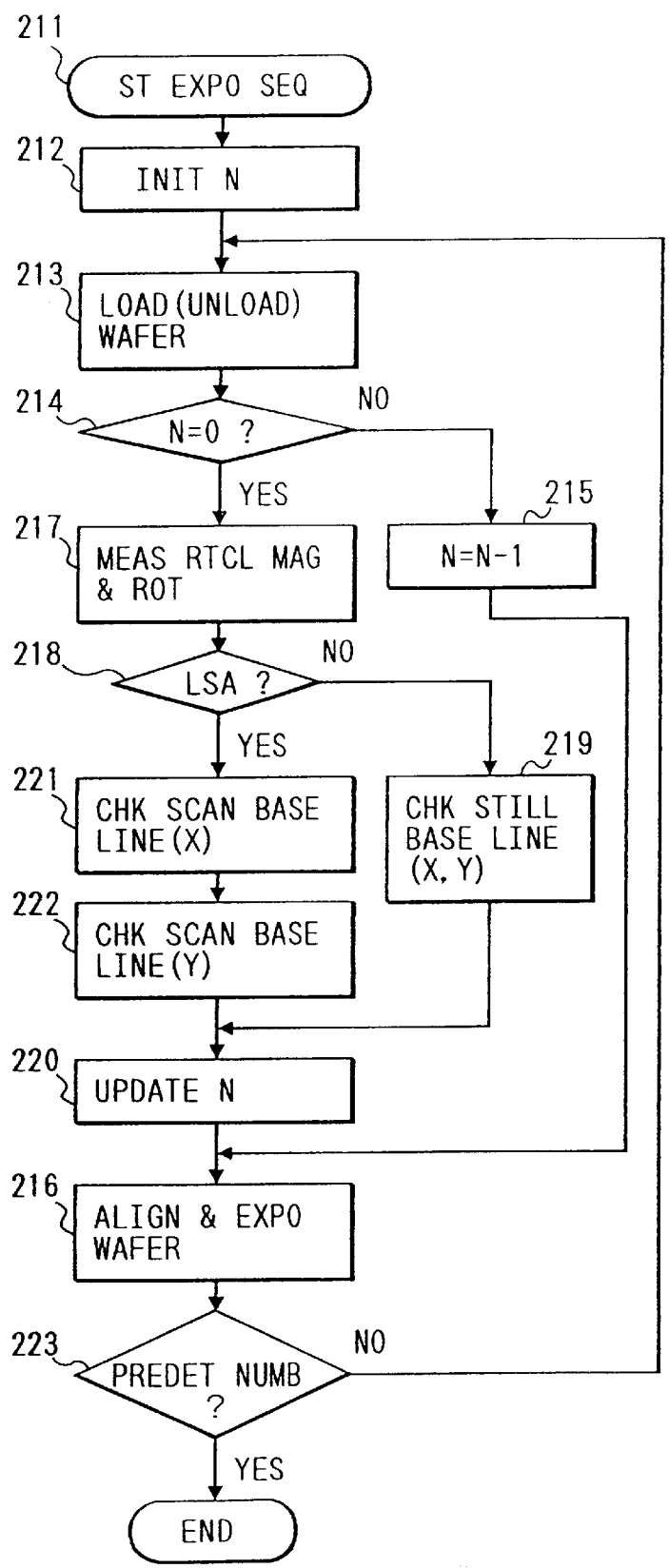
FIG. 13 is a flow chart showing an operation of consecutively exposing several hundred wafers in the embodiment.

First, the reticle R in FIG. 1 is replaced, and an exposure operation is started (step 211 in FIG. 13). In this case, reticle alignment and base line check operations in steps 204 to 210 in FIG. 10 are executed. Thereafter, in step 212, the number of wafers to be exposed until the next base line check is set, as an initial value, in a variable N. In step 213, a wafer is loaded on the wafer stage 6. Note that if there is an exposed wafer in step 213, a new wafer is loaded after the exposed wafer is unloaded.

In step 214, it is checked whether the variable N is 0, i.e., whether the timing of a base line check has come. If the variable N is larger than 0, 1 is subtracted from the variable N in step 215, and the flow advances to step 216. In step 216, after alignment of the wafer is performed by using the off-axis wafer alignment or the TTL wafer alignment system in FIG. 1, a pattern of the reticle R is exposed onto the respective shot areas of the wafer. If it is determined in step 223 that exposure to all the wafers (the desired number of wafers) is completed, the exposure process with respect to the reticle R is completed. If NO in step 223, the flow returns to step 213 to unload the exposed wafer and load a new wafer. Subsequently, the flow advances to step 214.

If it is determined in step 214 that N=0, i.e., the timing of a base line check has come, the rotational error and magnification error of the reticle R are measured in step 217. This operation is the same as in step 206 in FIG. 10. Thereafter, in step 218, the type of the sensor used for alignment is determined. If alignment is used by using a stationary alignment sensor, i.e., the off-axis wafer alignment system 9 or the LIA (two-beam interference alignment scheme) light-transmission systems 36X and 36Y, the flow advances to step 219. In this step, X- and Y-direction base line checks are performed with respect to the wafer alignment system 9 or the wafer alignment system of the two-beam interference alignment scheme. Thereafter, in step 220, the number of wafers to be exposed until the next base line check is set as the variable N. The flow then returns to step 216.

If it is determined in step 218 that alignment is performed by using a scanning alignment sensor, i.e., the LSA (laser step alignment) light-transmission a system 35, the flow advances to step 221. In this step, an X-direction base line check is performed with respect to the wafer alignment system of the laser step alignment scheme. In step 222, a Y-direction base line check is performed with respect to the wafer alignment system of the laser step alignment scheme. Thereafter, in step 220, the number of wafers to be exposed until the next base line check is set as the variable N. The flow then returns to step 216.

Figure 14:
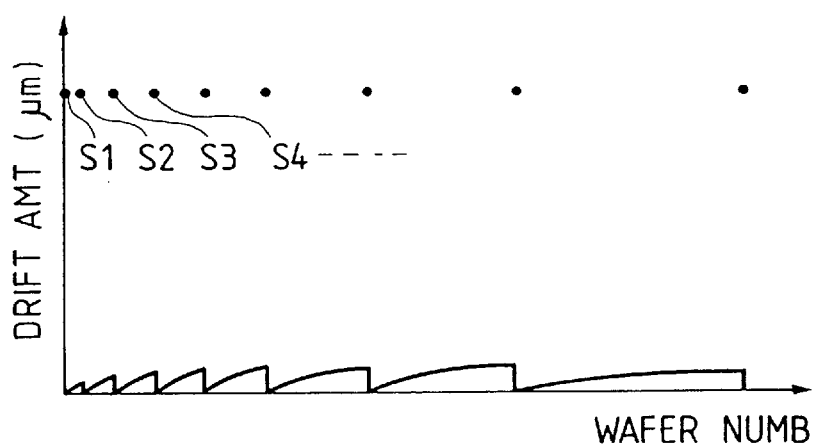
FIG. 14 is a graph showing an example of the timing of each base line check in the embodiment.
Figure 15A:
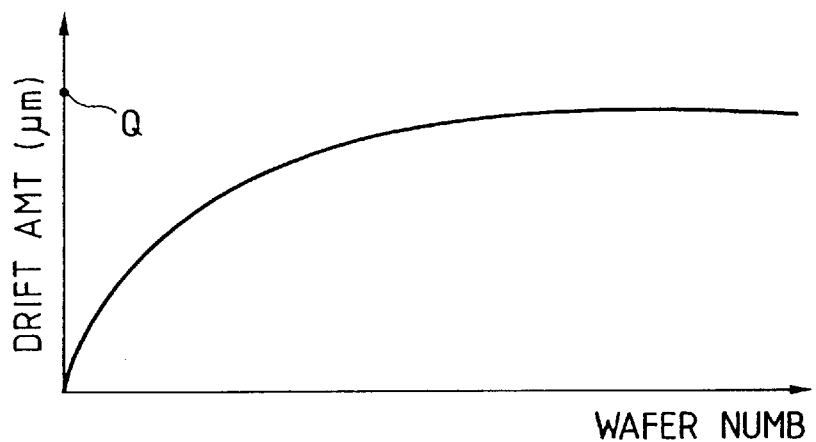
FIG. 15A is a graph showing an example of the timing of each base line check in the prior art.
Figure 15B:
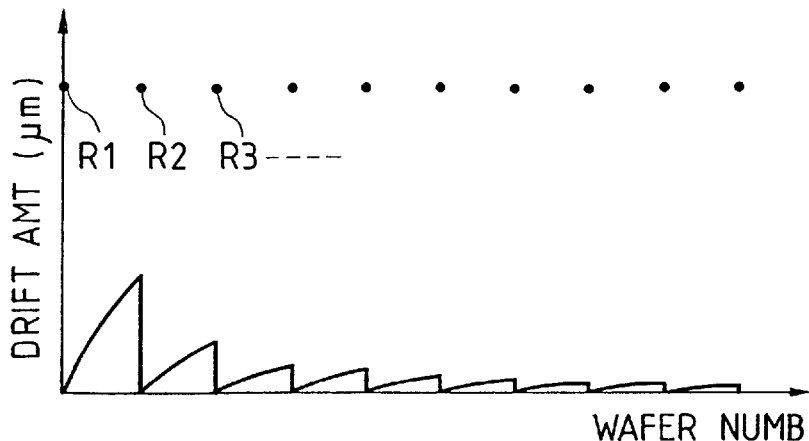
FIG. 15B is a graph showing another example of the timing of each base line check in the prior art.

FIG. 14 shows an example of the time intervals at which base line checks are performed in the embodiment. These time intervals are suitable for a case wherein a change in the drift amount of the base line amount is gradually reduced over time, as shown in FIG. 15A. Referring to FIG. 14, the abscissa represents the number of wafers to be exposed. Since the number of wafers is almost proportional to time, the abscissa may be regarded as a time base axis. The ordinate in FIG. 14 represents the drift amount of the base line amount. In the embodiment, a base line check is performed at time points S1, S2, S3, . . . as the intervals gradually increase. That is, a base line check is performed at short time intervals in an area where a change in drift amount is large, and a base line check is performed at long time intervals in an area where a change in drift amount is small. Therefore, the drift amount of the base line amount can be suppressed to an allowable value or less without decreasing the throughput.

As is apparent, if a change in the drift amount of the base line amount does not show the same tendency as that shown in FIG. 15A, the intervals of base line checks are adjusted accordingly. For example, the intervals of base line checks are shortened in an area where a change in drift amount is large, and the intervals of base line checks are prolonged in an area where a change in drift amount is small.

Figure 16:
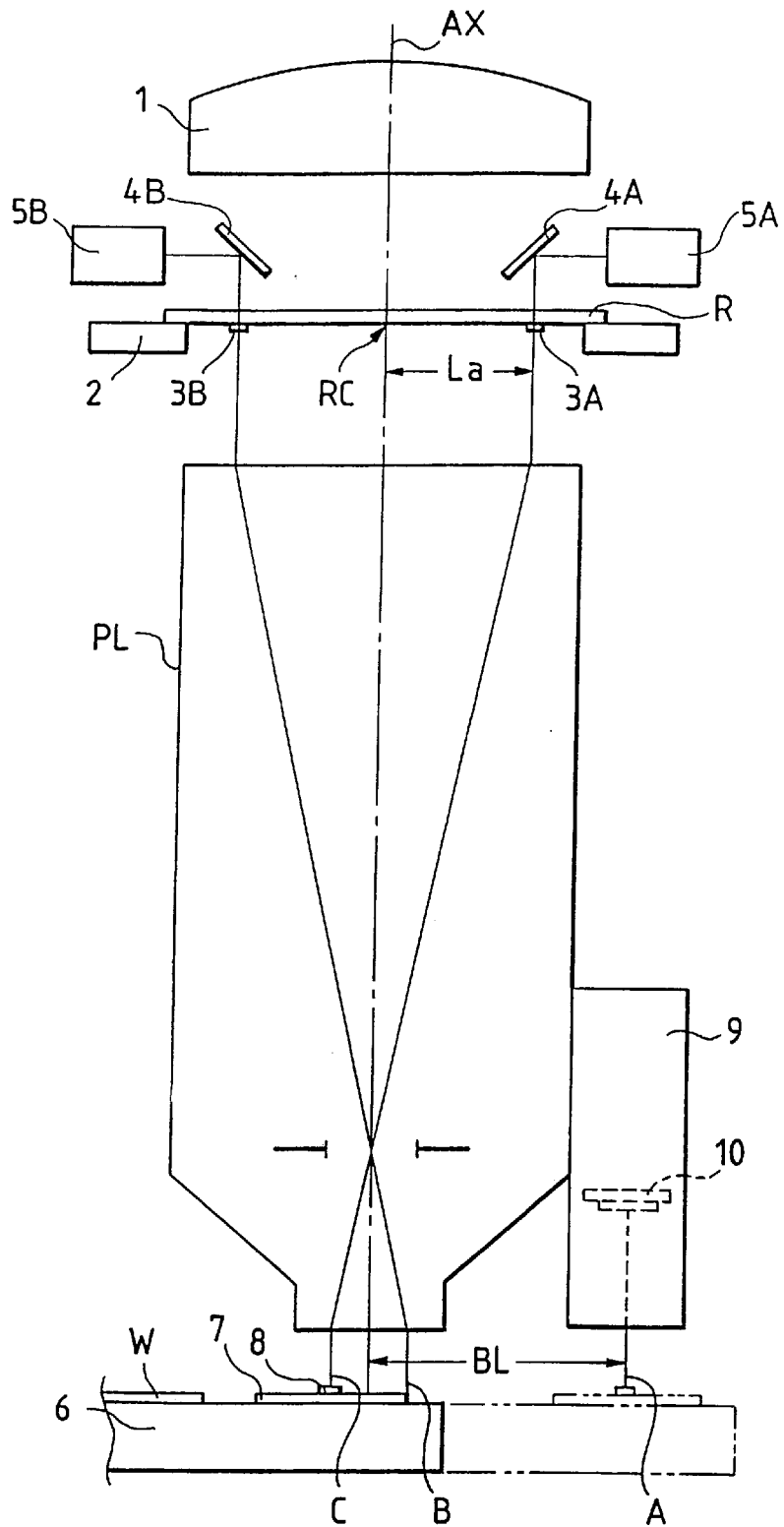
FIG. 16 is a front view showing a main part of a conventional projection exposure apparatus having an off-axis wafer alignment system.

The technique of changing the intervals of base line checks may be applied not only to a projection exposure apparatus using the large fiducial mark plate 17 as shown in FIG. 1 but also to a projection exposure apparatus designed to measure base line amounts by moving a fiducial mark plate as in, for example, the prior art shown in FIG. 16. As described above, the present invention is not limited to the above-described embodiment, and various changes and modifications can be made within the spirit and scope of the invention.

What is claimed is:

1. An exposure apparatus for exposing a pattern of a mask on a sensitive substrate, said apparatus comprising:

a mask stage which holds said mask;

a movable substrate stage which holds said sensitive substrate;

a projection optical system which is arranged between said mask stage and said movable substrate stage, and which images said mask pattern at a predetermined position on said sensitive substrate;

a first mark detecting system which detects a substrate mark formed on said sensitive substrate in a detection area positioned at a predetermined interval from an optical axis of said projection optical system;

a second mark detecting system which detects a mask mark formed at a predetermined position on said mask in the image field of said projection optical system;

a first fiducial mark member arranged on a part of said substrate stage, and which has a configuration capable of being detected by said first mark detecting system;

a second fiducial mark member arranged on a part of said substrate stage, and which has a configuration capable of being detected by said second mark detecting system through said projection optical system;

a fiducial plate which mounts said first fiducial mark member and said second fiducial mark member with a predetermined positional relationship so that said first fiducial mark member is positioned in the detection area of said first mark detecting system when said second fiducial mark member is positioned in a predetermined relationship with respect to a position where said mask mark is to be present in the image field of said projection optical system;

a substrate stage position measuring system which measures a position of said substrate stage; and a stage control system which is electrically connected to said substrate stage position measuring system, and which moves said substrate stage based on a coordinate system obtained by correcting a coordinate axis of said substrate stage position measuring system by an amount corresponding to a rotation error defined as an inclination of said fiducial plate with respect to said coordinate axis.

2. An apparatus according to claim 1, further comprising driving system which moves said second mark detecting system along a movement coordinate axis of said substrate stage.

3. An apparatus according to claim 1, wherein said first fiducial mark member includes a plurality of alignment marks, said substrate stage position measuring system has a movable mirror, and said inclination of said fiducial plate corresponds to an inclination of a straight line passing through centers of said plurality of alignment marks with respect to an axis defined by said movable mirror.

4. An exposure method for exposing mask patterns on a plurality of sensitive substrates by using an exposure apparatus including a mask stage for holding a patterned mask, a movable substrate stage for replaceably holding said sensitive substrates, a projection optical system for imaging said mask patterns at predetermined positions on said sensitive substrates, and substrate stage position measuring means for measuring a position of said substrate stage, said method comprising:

a first mark detecting operation of detecting a fiducial mark member formed on a fiducial plate in a detection area positioned at a predetermined interval from an optical axis of said projection optical system;

a second mark detecting operation of detecting said fiducial mark member at a predetermined position in the image field of said projection optical system;

a base line measurement operation of measuring a distance between a center position of said detection area and said optical axis of said projection optical system, the base line measurement operation being executed every time a predetermined number of said sensitive substrates have been replaced on said substrate stage or at intervals of a predetermined time; and an operation of changing said predetermined number of said sensitive substrates or said predetermined time as a unit for repetition of the baseline measurement operation.

5. A method according to claim 4, wherein said fiducial mark member has a first fiducial mark member and a second fiducial mark member, said first fiducial mark member and said second fiducial mark member are positioned at a predetermined interval so that said first fiducial mark member is positioned in said detection area when said second fiducial mark member is positioned in said image field, and the base line measurement operation includes an operation of measuring said distance in accordance with results of detecting by said first mark detecting operation and said second mark detecting operation.

6. A method according to claim 4, wherein the unit of repetition is set to be larger at a time near completion of the exposure of said sensitive substrates than at a start of the exposure of said sensitive substrates.

7. An exposure method for exposing mask patterns on a plurality of sensitive substrates by using an exposure apparatus including a mask stage for holding a patterned mask, a movable substrate stage for replaceably holding said sensitive substrates, a projection optical system for imaging said mask patterns at predetermined positions on said sensitive substrates, and substrate stage position measuring means for measuring a position of said substrate stage, said method comprising:

a mark detecting operation of detecting a fiducial mark member formed on a fiducial plate;

a calculating operation of calculating a rotation error defined as an inclination of said fiducial plate with respect to a coordinate axis of said substrate stage position measuring means; and a moving operation of moving said substrate stage based on a coordinate system obtained by correcting said coordinate axis of said substrate position measuring means by an amount corresponding to said rotation error.

8. A method of exposing a substrate with a pattern on a mask through a projection optical system, comprising:
holding said substrate and resetting a sensor for measuring a position of a movable stage;
measuring a base line amount of a detection system that is capable of detecting a mark on said substrate, said measuring being performed using a reference plate provided on said stage; and
moving said stage with reference to a position of a detection center of said detection system.

9. A method according to claim 8, further comprising:
measuring yaw of said stage relative to a reference coordinate system when measuring the base line amount;
measuring an inclination of said reference plate in relation to a movement coordinate system of said stage; and
moving said stage based on the yaw and the inclination.

10. A method of manufacturing a device, comprising exposing, in accordance with the exposure method as defined in claim 8, a photosensitive material attached on a substrate for the device to the pattern of the mask.

11. A method of exposing a substrate with a pattern on a mask through a projection optical system, comprising:
measuring a base line amount of a detection system that is capable of detecting a mark on said substrate, said measuring being performed using a reference plate provided on a stage that holds the substrate;
measuring an inclination of said reference plate in a relation to a movement coordinate system of said stage; and
moving said stage based on the inclination of said reference plate.

12. A method according to claim 11, wherein said inclination is measured based on a result of detection by a first mark detection system which detects a positional displacement amount between a conjugate image of a reference mark for the mask formed on said reference plate and a mask mark formed on the mask.

13. A method according to claim 12, wherein said stage is moved based on said base line amount, said inclination and a result of detection by a second mark detection system which detects the substrate mark formed on said substrate not through said mask.

14. A method according to claim 13, wherein said second mark detection system detects said substrate mark in either a first detection scheme in which the second mark detection system effects detection over said stage through said projection optical system or a second detection scheme in which the second mark detection system effects detection over said stage not through said projection optical system.

15. A method according to claim 12, wherein said first mark detection system picks up an image of the conjugate image of said reference mark for the mask arranged on said substrate stage and said mask mark while they are at a standstill and detects said positional displacement amount based on the result of said image pickup.

16. A method according to claim 15, wherein said reference mark for the mask includes a plurality of first mark groups having periodicity in a predetermined direction and a plurality of second mark groups having periodicity in a direction perpendicular to said predetermined direction;
said mask mark includes a first mask mark comprising a plurality of marks arranged side by side in said predetermined direction and a second mark comprising a plurality of marks arranged side by side in said direction perpendicular to said predetermined direction; and
said first mark detection system detects said positional displacement amount under a condition in which said first mask mark is kept between the conjugate images of said plurality of first mark groups and said second mask mark is kept between the conjugate images of said plurality of second mark groups.

17. A method of manufacturing a device, comprising exposing, in accordance with the exposure method as defined in claim 11, a photosensitive material attached on a substrate for the device to the pattern of the mask.

18. A method of producing an exposure apparatus which exposes a pattern of a mask on a substrate, comprising:
providing a mask stage which holds said mask;
providing a substrate stage which holds said substrate;
providing a projection optical system between said mask stage and said substrate stage;
providing a first detection system;
providing a second detection system;
providing a fiducial plate having a first mark detectable by said first detection system and a second mark detectable by said second detection system; and
providing a control system which moves said substrate stage in accordance with a corrected coordinate system of said substrate stage, wherein said control system corrects a predetermined coordinate system of said substrate stage, based on an inclination of said fiducial plate with respect to said predetermined coordinate system of said substrate stage, to obtain said corrected coordinate system.

19. A method according to claim 18, wherein said first detection system has a detection point spaced a predetermined distance from a predetermined reference point in a field of projection of said projection optical system, and said second detection system detects said second mark through said projection optical system.

20. A method according to claim 18, wherein an interval between said first mark and said second mark in a predetermined direction is determined in accordance with a distance between a predetermined projection point of said projection optical system and a center of detection of said first detection system.

21. A method according to claim 18, wherein said fiducial plate has two second marks, and said control system calculates an inclination of said fiducial plate based on a detection result obtained by detecting said second marks with said second detection system and an interval between said second marks.

22. A method of producing an exposure apparatus which exposes a pattern of a mask on a substrate through a projection optical system, comprising:
providing a substrate stage which holds said substrate;
providing an alignment system having a center of detection disposed at a distance from a reference point in a field of projection of said projection optical system; and
providing a control system which controls a movement of said substrate stage in accordance with a detection result of said alignment system and said distance, wherein an operation of said control system is variable based on a predetermined number of exposed substrates or a predetermined time period as a unit for determining said distance.

23. A method according to claim 22, wherein said control system is operative, in a course of exposing a plurality of substrates, to adjust said predetermined number of substrates or said predetermined time period to be larger than at an initiation of said course of exposing said plurality of substrates.

24. An exposure method using a projection exposure apparatus having a mask stage which positions a mask formed with a pattern to be exposed and a mark for alignment and fixes said mask, a substrate stage which holds and positions a substrate formed with a plurality of substrate marks, a projection optical system which projects and images the pattern of said mask onto an area in a neighborhood of said substrate marks on said substrate held on said substrate stage, a first mark detection system which detects said substrate mark on said substrate not through said mask, and a second mark detection system which detects a positional displacement amount between a conjugate image of a reference mark for the mask arranged on said substrate stage and the mark of said mask through said projection optical system, wherein said projection exposure apparatus further comprises a plurality of interferometers which detect position information of said substrate stage, and said exposure method comprises:

obtaining a relationship between measurement values of said interferometers; and detecting, after obtaining the relationship between measurement values of the interferometers, a positional displacement amount between the conjugate image of the reference mark for the mask and the mark of the mask using said second mark detection system, and effecting positioning of said mask based on a result of said detecting.

25. A method according to claim 24, wherein said second mark detection system picks up an image of the conjugate image of said reference mark for the mask arranged on said substrate stage and said mask mark while they are at a standstill and detects said positional displacement amount based on the result of said image pickup.

26. A method according to claim 25, wherein said reference mark for the mask includes a plurality of first mark groups having periodicity in a predetermined direction and a plurality of second mark groups having periodicity in a direction perpendicular to said predetermined direction;

said mask mark includes a first m ask mark comprising a plurality of marks arranged side by side in said predetermined direction and a second mark comprising a plurality of mark s arranged side by side in said direction perpendicular to said predetermined direction; and said second mark detection system detects said positional displacement amount under a condition in which said first mask mark is kept between the conjugate images of said plurality of first mark groups and said second mask mark is kept between the conjugate images of said plurality of second mark groups.

27. A method according to claim 24, wherein said first mark detection system detects said substrate mark on said substrate in either a first detection scheme in which the second mark detection system effects detection over said substrate stage through said projection optical system or a second detection scheme in which the second mark detection system effects detection over said substrate stage not through said projection optical system.

28. A method of manufacturing a device, comprising exposing, in accordance with the exposure method as defined in claim 24, a photosensitive material attached on a substrate for the device to the pattern of the mask.

29. An exposure apparatus for exposing a predetermined pattern onto a plurality of substrates successively, comprising:

a projection system which projects said predetermined pattern onto said substrate;

a substrate observation system which observes a pattern for positioning formed on said substrate;

a measurement system which measures a base line amount that represents a distance between a predetermined projection position within a projection area of said projection system and a predetermined observation position within an observation area of said substrate observation system; and a setting device which sets timing of said base line amount measurement by said measurement system;

wherein next base line amount measurement timing is set by said setting device after measurement of the base line amount is effected at the timing that has been set by said setting device and before completion of the projection of said predetermined pattern onto all of said plurality of substrates.

30. An apparatus according to claim 29, wherein said setting device sets said measurement timing with unfixed intervals utilizing the number of said substrates or time as its unit.

31. An apparatus according to claim 29, wherein a rotation error of said mask and a magnification error of said projection system are measured using a reference member as a reference at the same time with the base line amount measurement by said measurement system.

32. A method for exposing a plurality of substrates successively, comprising:

measuring, at a measurement timing that has been set in advance, a base line amount that represents a distance between a predetermined projection position of a projection system which projects a predetermined pattern onto said substrate and a predetermined observation position of a substrate observation system which observes a pattern for positioning formed on said substrate; and setting next base line amount measurement timing after measurement of the base line amount is effected at the timing that has been set in advance and before completion of the projection of said predetermined pattern onto all of said plurality of substrates.

33. A method according to claim 32, wherein said next measurement timing is set using the number of the substrates or time as its unit, and said next measurement timing is different from said timing that has been set in advance.

34. A method of manufacturing a device, comprising exposing, in accordance with the exposure method as defined in claim 32, a photosensitive material attached on a substrate for the device to the pattern of the mask.

* * * * *